(12) United States Patent
Colombo et al.

(10) Patent No.: US 12,019,118 B2
(45) Date of Patent: Jun. 25, 2024

(54) PROCESSING SYSTEM, RELATED INTEGRATED CIRCUIT, DEVICE AND METHOD

(71) Applicants: STMicroelectronics International N.V., Geneva (CH); STMicroelectronics Application GmbH, Aschheim-Dornach (DE)

(72) Inventors: Roberto Colombo, Munich (DE); Vivek Mohan Sharma, New Delhi (IN); Samiksha Agarwal, New Delhi (IN)

(73) Assignees: STMicroelectronics International N.V., Geneva (CH); STMicroelectronics Application GmbH, Aschheim-Dornach (DE)

(*) Notice: Subject to any disclaimer, the term of this patent is extended or adjusted under 35 U.S.C. 154(b) by 0 days.

(21) Appl. No.: 18/186,549

(22) Filed: Mar. 20, 2023

(65) Prior Publication Data
US 2023/0349969 A1    Nov. 2, 2023

(30) Foreign Application Priority Data

Apr. 1, 2022    (IT) .................. 102022000006455

(51) Int. Cl.
*G01R 31/317* (2006.01)
(52) U.S. Cl.
CPC . *G01R 31/31703* (2013.01); *G01R 31/31722* (2013.01)

(58) Field of Classification Search
None
See application file for complete search history.

(56) References Cited

U.S. PATENT DOCUMENTS 11,209,482 B1    12/2021    Sharma et al.

FOREIGN PATENT DOCUMENTS

| EP | 3534261 A1 | 9/2019 |
|---|---|---|
| EP | 3534262 A1 | 9/2019 |
| EP | 4075271 A1 | 10/2022 |

OTHER PUBLICATIONS

Au, K., "Iterative CMOS Magnitude Comparator Cell", Motorola, Technical Developments, vol. 5, Oct. 1985, 2 pages.

*Primary Examiner* — Guerrier Merant
(74) *Attorney, Agent, or Firm* — Slater Matsil, LLP

(57) ABSTRACT

In an embodiment a processing system includes a test circuit configured to set an address value, an upper address limit and a lower address limit to a given reference bit sequence, verify whether the upper-limit comparison signal has a respective third logic level and/or whether the lower-limit comparison signal has the respective third logic level, assert an error signal in response to determining that the upper-limit comparison signal does not have the respective third logic level or the lower-limit comparison signal does not have the respective third logic level, repeat a certain operation for each of the N bits.

20 Claims, 16 Drawing Sheets

PROCESSING SYSTEM, RELATED INTEGRATED CIRCUIT, DEVICE AND METHOD

CROSS-REFERENCE TO RELATED APPLICATIONS

This application claims the benefit of Italian Application No. 102022000006455, filed on Apr. 1, 2022, which application is hereby incorporated herein by reference.

TECHNICAL FIELD

Embodiments of the present disclosure relate to the error management within processing systems, such as micro-controllers.

BACKGROUND

FIG. 1 shows a typical electronic system, such as the electronic system of a vehicle, comprising a plurality of processing systems 10, such as embedded systems or integrated circuits, e.g., a Field Programmable Gate Array (FPGA), a Digital Signal Processor (DSP) or a micro-controller (e.g., dedicated to the automotive market).

For example, in FIG. 1 are shown three processing systems $10_1$, $10_2$ and $10_3$ connected through a suitable communication system 20. For example, the communication system may include a vehicle control bus, such as a Controller Area Network (CAN) bus, and possibly a multimedia bus, such as a Media Oriented Systems Transport (MOST) bus, connected to vehicle control bus via a gateway. Typically, the processing systems 10 are located at different positions of the vehicle and may include, e.g., an Engine Control Unit, a Transmission Control Unit (TCU), an Antilock Braking System (ABS), a Body Control Module (BCM), and/or a navigation and/or multimedia audio system. Accordingly, one or more of the processing systems 10 may also implement real-time control and regulation functions. These processing systems are usually identified as Electronic Control Units.

In this respect, future generation of such processing systems 10, e.g., micro-controllers adapted to be used in automotive applications, are expected to exhibit an increase in complexity, mainly due to the increasing number of requested functionalities (new protocols, new features, etc.) and to the tight constraints of execution conditions (e.g., lower power consumption, increased calculation power and speed, etc.). For example, recently more complex multi-core processing systems 10 have been proposed. For example, such multi-core processing systems may be used to execute (in parallel) several of the processing systems 10 shown in FIG. 1, such as several ECUs of a vehicle.

FIG. 2 shows an example of a processing system 10, such as a multi-core processing system. Specifically, in the example considered, the processing system 10 comprises one or more processing cores 102, such as a plurality of n processing cores $102_1 \ldots 102_n$, connected to a (on-chip) communication system 114. For example, in the context of real-time control systems, the processing cores $102_1, \ldots 102_n$ may be ARM Cortex®-R52 cores. Generally, the communication system 114 may comprise one or more bus systems, e.g., based on the Advanced eXtensible Interface (AXI) bus architecture, and/or a Network-on-Chip (NoC).

For example, as shown at the example of the processing core $102_1$, each processing core 102 may comprise a microprocessor 1020 and a communication interface 1022 configured to manage the communication between the microprocessor 1020 and the communication system 114. Typically, the interface 1022 is a master interface configured to forward a given (read or write) request from the microprocessor 1020 to the communication system 114, and forward an optional response from the communication system 114 to the microprocessor 1020. However, the communication interface 1022 may also comprise a slave interface. For example, in this way, a first microprocessor 1020 may send a request to a second microprocessor 1020 (via the communication interface 1022 of the first microprocessor, the communication system 114 and the communication interface 1022 of the second microprocessor). Generally, each processing core $102_1 \ldots 102_n$ may also comprise further local resources, such as one or more local memories 1026, usually identified as Tightly Coupled Memory TCM).

Typically, the processing cores 102 are arranged to exchange data with one or more non-volatile memories 104 and/or one or more volatile memories 104b. Generally, the memories 104 and/or 104b may be integrated with the processing cores $10_2$ in a single integrated circuit, or the memories 104 and/or 104b may be in the form of a separate integrated circuit and connected to the processing cores 102, e.g., via the traces of a printed circuit board.

Specifically, in a multi-core processing system 10 these memories are often system memories, i.e., shared for the processing cores $102_1, \ldots 102_n$. For example, for this purpose, the communication with the memories 104 and/or 104b may be performed via one or more memory controllers 100 connected to the communication system 114. As mentioned before, each processing cores 102 may, however, comprise one or more additional local memories 1026.

For example, the software executed by the microprocessor(s) 1020 is usually stored in a non-volatile program memory 104, such as a Flash memory or EEPROM, i.e., the memory 104 is configured to store the firmware of the processing unit 102, wherein the firmware includes the software instructions to be executed by the microprocessor 102. Generally, the non-volatile memory 104 may also be used to store other data, such as configuration data, e.g., calibration data. Conversely, a volatile memory 104b, such as a Random-Access-Memory (RAM), may be used to store temporary data.

Often, the processing system 10 comprises also one or more (hardware) resources/peripherals 106, e.g., selected from the group of:

one or more communication interfaces, e.g., for exchanging data via the communication system 20, such as a Universal asynchronous receiver/transmitter (UART), Serial Peripheral Interface Bus (SPI), Inter-Integrated Circuit (I²C), Controller Area Network (CAN) bus, and/or Ethernet interface, and/or a debug interface; and/or one or more analog-to-digital converters and/or digital-to-analog converters; and/or one or more dedicated digital components, such as hardware timers and/or counters, or a cryptographic co-processor; and/or one or more analog components, such as comparators, sensors, such as a temperature sensor, etc.; and/or one or more mixed signal components, such as a PWM (Pulse-Width Modulation) driver.

Generally, a dedicated digital component may also correspond to a FPGA integrated in the processing system 10. For example, in this case, the memory 104 may also comprise the program data for such a FPGA.

The resources 106 are usually connected to the communication system 114 via a respective communication interface 1062, such as a peripheral bridge. For example, for this purpose, the communication system 114 may indeed comprise an Advanced Microcontroller Bus Architecture (AMBA) High-performance Bus (AHB), and an Advanced Peripheral Bus (APB) used to connect the resources/peripherals 106 to the AMBA AHB bus. In general, the communication interface 1062 comprises at least a slave interface. For example, in this way, a processing core 102 may send a request to a resource 106 and the resource returns given data. Generally, one or more of the communication interfaces 1062 may also comprise a respective master interface. For example, such a master interface, often identified as integrated Direct Memory Access (DMA) controller, may be useful in case the resource has to start a communication in order to exchange data via (read and/or write) request with another circuit connected to the communication system 114, such as a resource 106 or a processing core 102.

Often such processing systems 10 comprise also one or more general-purpose DMA controllers 110. For example, as shown in FIG. 2, a DMA controller 110 may be used to directly exchange data with a memory, e.g., the memory 104b, based on requests received from a resource 106. For example, in this way, a communication interface may directly read data (via the DMA controller 110) from the memory 104b and transmit these data, without having to exchange further data with a processing unit 102. Generally, a DMA controller 110 may communicate with the memory or memories via the communication system 114 or via one or more dedicated communication channels.

In this respect, irrespective of the complexity of the processing system 10 (e.g., with respect to the number of processing cores 102 and/or number and type of the resources 106), at least one of the circuits 100, 102, 106 and 110 may generate one or more error signals $ERR_1, \ldots, ERR_m$, which are provided to a fault collection and error management circuit 120. For example, such error signals ERR may be generated by at least one of:

- a memory controller 100 supporting an error detection and/or correction function, which generates an error signal $ERR_1$ when the data read from the memory 104 or 104b contain errors and/or when data could not be written to the memory,
- a processing core 102 configured to generate an error signal $ERR_2$ in response to a hardware and/or software failure; and
- a communication interface 106 configured to generate an error signal $ERR_3$, corresponding to a hard error signal indicative of a hardware failure and/or a soft error signal indicative of a data transmission error.

Additionally, one or more error signals ERR may be generated by monitoring the supply voltage of the processing system 10 (e.g., in order to detect over and/or under voltage conditions), the clock signal of the processing system 10 (e.g., in order to detect whether the clock frequency is out of range), and/or the temperature of the processing system 10 (e.g., in order to detect whether the current operating temperate is out of range).

For example, European patent application n. EP 3 534 261 A1 or Italian patent application n. 102021000009683 disclose possible embodiments of a fault collection and error management circuit 120, which is incorporated herein by reference for this purpose.

FIG. 3 shows a possible implementation of the fault collection and error management circuit 120. In the example considered, the fault collection and error management circuit 120 comprises a register 1200. Specifically, in the example considered, the register 1200 comprises one or more error bits EB for storing the value of the error signals ERR. For example, considering the exemplary case of three error signals $ERR_1 \ldots ERR_3$, the register 1200 may comprise a corresponding number of error bits EB.

In the example considered, the fault collection and error management circuit 120 comprises an internal reaction circuit 1202. Specifically, the internal reaction circuit 1202 may be configured to generate the interrupt signal IRQ and/or the reset request signal RST as a function of the content of the error bits EB of the register 1200. The error bits EB are purely optional and the external reaction circuit 1202 may generate the interrupt signal IRQ and/or the reset request signal RST also directly as a function of the error signal(s) ERR.

Similarly, the fault collection and error management circuit 120 may comprises an external reaction circuit 1204. Specifically, the external reaction circuit 1204 may be configured to generate an error trigger signal ET provided to a terminal (pin/pad) of the processing system 10, e.g., in order to signal the error to an external circuit, and/or a signal SET used to set the output level of one or more safety critical terminals of the processing system 10. Again, the error bits EB are purely optional and the external reaction circuit 1204 may generate the signal ET and/or the signal SET also directly as a function of the error signal(s) ERR.

In general, the behavior of the reaction circuits 1202 and/or 1204 may also be programmable, e.g., by setting one or more configuration bits in the register 1200. For example, in the example considered, the register 1200 comprises:

- a respective interrupt enable bit IE for each of the error signals $ERR_1 \ldots ERR_3$, i.e., the interrupt signal IRQ is asserted when also the respective interrupt enable bit IE of an asserted error signal ERR is asserted;
- a respective error trigger enable bit ETE for each of the error signals $ERR_1 \ldots ERR_3$, i.e., the error trigger signal ET is asserted when also the respective error trigger enable bit ETE of an asserted error signal ERR is asserted.

Similarly, the register 1200 may comprise respective reset enable bits for the reset request signal REQ and/or respective enable bits for the safety signal SET.

In order to simplify the data exchange between the processing unit 102 and the registers 1200, the register 1200 may be directly addressable by the processing core(s) 102, which is schematically shown in FIG. 2, where the fault collection and error management circuit 120 is connected to the communication system 114.

A shown in FIG. 4, the error signals ERR are usually generated by dedicated safety-monitor circuits SM. For example, such safety-monitor circuits may comprise combinational and/or sequential logic circuits, which monitor the operation of a given circuit. Generally, such safety-monitor circuits SM may also comprise analog components, e.g., in order to detect an out-of-range condition for an analog signal, such as an internal supply voltage or a signal indicative of the operating temperature of the processing system or a specific circuit of the processing system. For example, FIG. 4 shows a safety-monitor circuit $SM_{100}$ configured to monitor one or more signals of the memory controller 100, a safety-monitor circuit $SM_{102}$ configured to monitor one or more signals of a processing core 102 and a safety-monitor circuit $SM_{106}$ configured to monitor one or more signals of a resource/peripheral 106. Generally, the safety-monitor circuit may also be integrated in the respective circuit.

Accordingly, typically each safety-monitor circuit SM monitors one or more signals generated by and/or provided to the associated circuit, and determines whether the behavior of the signal(s) is normal or indicates an error. For example, in many processing systems 10, one or more of such safety-monitor circuits SM (or directly the respective circuit monitored by the safety monitor circuit SM) may comprise a comparison circuit configured to compare an address signal ADR with a given address range.

For example, such an address comparison circuit is usually used in a Memory Protection Unit (MPU) of a processing core 102, wherein the MPU is configured to manage the forwarding of read or write requests generated by the respective microprocessor 1020 to the communication system 114, e.g., the forwarding of read or write requests generated by a respective microprocessor 1020 to the communication interface 1022. For example, a MPU is used in a Protected Memory System Architecture (PMSA), such as an ARM AArch32 architecture with PMSA, wherein the MPU permits to specify, e.g., via one or more access-right tables, directly the physical addresses/address ranges the microprocessor 1020 and/or a software task executed by a microprocessor 1020 may access and/or may not access), e.g., the MPU may be configured to:

when the request received by a microprocessor 1020 comprises a physical address permitted via the access-rights table, forward the request to the communication system 114; or when the request received by a microprocessor 1020 comprises a physical address not permitted via the access-rights table, reject the request/inhibit the forwarding of the request.

Accordingly, when the safety-monitor circuit $SM_{102}$ associated with the MPU of a processing core 102 detects a request to a blocked address (as signaled via the comparison circuit of the MPU), the respective safety monitor circuit $SM_{102}$ should assert the respective error signal $ERR_1$, thereby signaling the error to the fault collection and error management circuit 120.

Such an address comparison circuits may also be used in a safety-monitor circuit of a memory controller 100 used to determine the behavior in case of Error Correction Code (ECC) errors of a memory 104 and/or 104b. For example, such memories may store ECC bits used to implement a Single Error Correction and Double Error Detection (SECDED) scheme. For example, in this case, the memory range may be split into different areas (via one or more comparison circuits), assigning a specific and programmable error reaction for each region. For example, in this way, a safety-monitor circuit $SM_{100}$ used to monitor a memory area containing safety-critical data may be configured to already assert the respective error signal $ERR_1$ in case of a correctable single-bit error, while another safety monitor circuit SM used to monitor a memory area containing uncritical data may be configured to just assert the respective error signal $ERR_1$ in case of an uncorrectable double-bit error. For example, such a solution is disclosed in European Patent Application EP 3 534 262 A1, which is incorporated herein by reference for this purpose.

The inventors have observed that it may be particularly relevant to ensure the proper functionality of such comparison circuits. For example, a malfunction of a comparison circuit of a MPU would imply that the address protection is not work correctly, which implies that the concept of freedom from interference (one of the pillars of the ISO26262 specification) is infringed.

SUMMARY

Embodiments provide solutions for verifying the correct operation of such address comparison circuits.

As mentioned before, various embodiments of the present disclosure relate to a processing system comprising an address comparison circuit configured to compare an address value with an upper address limit and a lower address limit. For this purpose, the address comparison circuit comprises a first iterative digital comparator and a second iterative digital comparator.

Specifically, the first iterative digital comparator is configured to compare the address value with the upper address limit. When the address value is smaller than the upper address limit, the first comparator sets an upper-limit comparison signal to a first logic level, e.g., high. When the address value is greater than the upper address limit, the first comparator sets the upper-limit comparison signal to a second logic level, e.g., low. Finally, when the address value corresponds to the upper address limit, the first comparator sets the upper-limit comparison signal to a third logic level, wherein the third logic level corresponds to the first logic level or the second logic level based on the implementation of the first comparator.

For example, for this purpose, the first iterative digital comparator may comprise a cascade of a first set of bit comparators, wherein each bit comparator of the first set of bit comparators is configured to generate a respective comparison signal.

Specifically, a first bit comparator of the first set of bit comparators is configured to receive a first bit of the address value and a first bit of the upper address limit. When the first bit of the address value is set to low and the first bit of the upper address limit is set to high, the first bit comparator sets the respective comparison signal to the respective first logic level. When the first bit of the address value is set to high and the first bit of the upper address limit is set to low, the first bit comparator sets the respective comparison signal to the respective second logic level. Finally, when the first bit of the address value corresponds to the first bit of the upper address limit, the first bit comparator sets the respective comparison signal to the respective third logic level.

Conversely, the other bit comparators of the first set of bit comparators are configured to receive a respective bit of the address value, a respective bit of the upper address limit and the comparison signal of a previous bit comparator of the first set of bit comparators. Specifically, when the respective bit of the address value is set to low and the respective bit of the upper address limit is set to high, the bit comparator sets the respective comparison signal to the respective first logic level. When the respective bit of the address value is set to high and the respective bit of the upper address limit is set to low, the bit comparator sets the respective comparison signal to the respective second logic level. Finally, when the respective bit of the address value corresponds to the respective bit of the upper address limit, the bit comparator sets the respective comparison signal to the logic value of the comparison signal of the previous bit comparator. Accordingly, in this case, the upper-limit comparison signal may correspond to the comparison signal of the last bit comparator of the first set of bit comparators.

In various embodiments, the second iterative digital comparator is configured to compare the address value with the lower address limit. Specifically, when the address value is greater than the lower address limit, the second comparator sets a lower-limit comparison signal to a first logic level, e.g., high. When the address value is smaller than the lower address limit, the second comparator sets the lower-limit comparison signal to a second logic level, e.g., low. Finally, when the address value corresponds to the lower address limit, the second comparator sets the lower-limit comparison signal to a third logic level, wherein the third logic level corresponds to the first logic level or the second logic level based on the implementation of the second comparator.

For example, for this purpose, the second iterative digital comparator may comprise a cascade of a second set of bit comparators, wherein each bit comparator of the second set of bit comparators is configured to generate a respective comparison signal.

Specifically, a first bit comparator of the second set of bit comparators is configured to receive a first bit of the address value and a first bit of the lower address limit. When the first bit of the address value is set to high and the first bit of the lower address limit is set to low, the first bit comparator sets the respective comparison signal to the respective first logic level. When the first bit of the address value is set to low and the first bit of the lower address limit is set to high, the first bit comparator sets the respective comparison signal to the respective second logic level. Finally, when the first bit of the address value corresponds to the first bit of the lower address limit, the first bit comparator sets the respective comparison signal to the respective third logic level.

Conversely, the other bit comparators of the second set of bit comparators are configured to receive a respective bit of the address value, a respective bit of the lower address limit and the comparison signal of a previous bit comparator of the second set of bit comparators. Specifically, when the respective bit of the address value is set to high and the respective bit of the lower address limit is set to low, the bit comparator sets the respective comparison signal to the respective first logic level. When the respective bit of the address value is set to low and the respective bit of the lower address limit is set to high, the bit comparator sets the respective comparison signal to the respective second logic level. Finally, when the respective bit of the address value corresponds to the respective bit of the lower address limit, the bit comparator sets the respective comparison signal to the logic value of the comparison signal of the previous bit comparator. Accordingly, in this case, the lower-limit comparison signal may correspond to the comparison signal of the last bit comparator.

In various embodiments, a combinational logic circuit may thus be configured to assert a combined comparison signal when the upper-limit comparison signal has the respective first logic level and the lower-limit comparison signal has the respective first logic level. Conversely, the combinational logic circuit may de-assert the combined comparison signal when the upper-limit comparison signal has the respective second logic level or the lower-limit comparison signal has the respective second logic level.

As mentioned before, various embodiments of the present disclosure relate to solutions for testing such address comparison circuits. Specifically, in various embodiments, the processing system comprises for this purpose a test circuit.

Specifically, in various embodiments, the test circuit is configured to set the address value, the upper address limit and the lower address limit to the same given reference bit sequence. For example, the given reference bit sequence may correspond to a first reference sequence having all bits set to low or a second reference sequence having all bits set to high. In various embodiments, the test circuit may also receive a first signal, and select the first reference sequence or the second reference sequence as a function of the first signal.

Next, the test circuit verifies whether the upper-limit comparison signal has the respective third logic level and/or whether the lower-limit comparison signal has the respective third logic level. In response to determining that the upper-limit comparison signal does not have the respective third logic level or the lower-limit comparison signal does not have the respective third logic level, the test circuit may thus assert an error signal.

In various embodiments, the test circuit repeats various operations for each of the N bits.

Specifically, in various embodiments, the test circuit sets the respective bit of the address value to high, and sets the respective bit of the upper address limit and the lower address limit to low. Next, the test circuit verifies whether the upper-limit comparison signal has the respective second logic level and/or whether the lower-limit comparison signal has the respective first logic level. In response to determining that the upper-limit comparison signal has the respective first logic level or the lower-limit comparison signal has the respective second logic level, the test circuit may thus assert the error signal.

Moreover, in various embodiments, the test circuit sets the respective bit of the address value to low, and sets the respective bit of the upper address limit and the lower address limit to high. Next, the test circuit verifies whether the upper-limit comparison signal has the respective first logic level and/or whether the lower-limit comparison signal has the respective second logic level. In response to determining that the upper-limit comparison signal has the respective second logic level or the lower-limit comparison signal has the respective first logic level, the test circuit may thus assert the error signal.

Finally, the test circuit sets the respective bit of the address value, the upper address limit and the lower address limit to a given logic level, whereby the address value, the upper address limit and the lower address limit have again the same value. For example, the given logic level may correspond to the logic level of the respective bit of the reference sequence. For example, when the reference bit sequence corresponds to the first reference sequence, the given logic level may be low. Conversely, when the reference bit sequence corresponds to the second reference sequence, the given logic level may be high.

In various embodiments, the test circuit may be configured to determine the result of the tests by monitoring the combined comparison signal. For example, in this case, the test circuit may receive a second signal and, in response to determining that the second signal has a first logic level, mask the lower-limit comparison signal by setting the lower-limit comparison signal to the respective first logic level. Accordingly, in this case, the test circuit may verify whether the upper-limit comparison signal has the respective first logic level by verifying whether the combined comparison signal is asserted. Similarly, the test circuit may verify whether the upper-limit comparison signal has the respective second logic level by verifying whether the combined comparison signal is de-asserted. Similarly, in response to determining that the second signal has a second logic level, the test circuit may mask the upper-limit comparison signal by setting the upper-limit comparison signal to the respective first logic level. Accordingly, the test circuit may verify whether the lower-limit comparison signal has the respective first logic level by verifying whether the combined comparison signal is asserted. Similarly, the test circuit may verify whether the lower-limit comparison signal has the respective second logic level by verifying whether the combined comparison signal is de-asserted.

Accordingly, in various embodiments, the processing circuit may comprise a sequential logic circuit configured to perform a test of the first iterative digital comparator by setting the second signal to the first logic level and verifying whether the error signal is asserted. Similarly, the sequential logic circuit may perform a test of the second iterative digital comparator by setting the second signal to the second logic level and verifying whether the error signal is asserted. For example, in various embodiments, the sequential logic circuit sets the first signal to the first logic level and performs a first test of the first iterative digital comparator. Next, the sequential logic circuit sets the first signal to the second logic level and performs a second test of the first iterative digital comparator. Similarly, the sequential logic circuit may set the first signal to the first logic level and perform a first test of the second iterative digital comparator, and set the first signal to the second logic level and perform a second test of the second iterative digital comparator.

BRIEF DESCRIPTION OF THE DRAWINGS

Embodiments of the present disclosure will now be described with reference to the annexed drawings, which are provided purely by way of non-limiting example and in which.

DETAILED DESCRIPTION OF ILLUSTRATIVE EMBODIMENTS

In the following description, numerous specific details are given to provide a thorough understanding of embodiments. The embodiments can be practiced without one or several specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

In the following FIGS. 5 to 18 parts, elements or components which have already been described with reference to FIGS. 1 to 4 are denoted by the same references previously used in such Figure; the description of such previously described elements will not be repeated in the following in order not to overburden the present detailed description.

As mentioned before, various embodiments of the present disclosure provide solutions for verifying the correct operation of one or more address comparison circuits of a processing system. As mentioned before, often such address comparison circuits form part of the error detection and management circuit as implemented, e.g., with a plurality of safety-monitor circuits SM and a fault collection and error management circuit 120. For a general description of these circuits may thus be made reference to the previous description of FIGS. 1 to 4.

Figure 1:
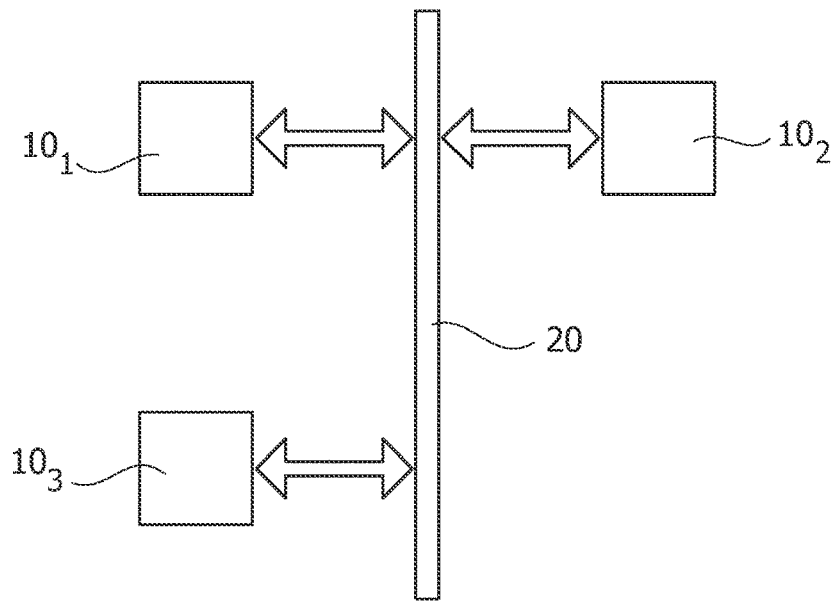
FIG. 1 shows an example of an electronic system comprising a plurality of processing systems.
Figure 2:
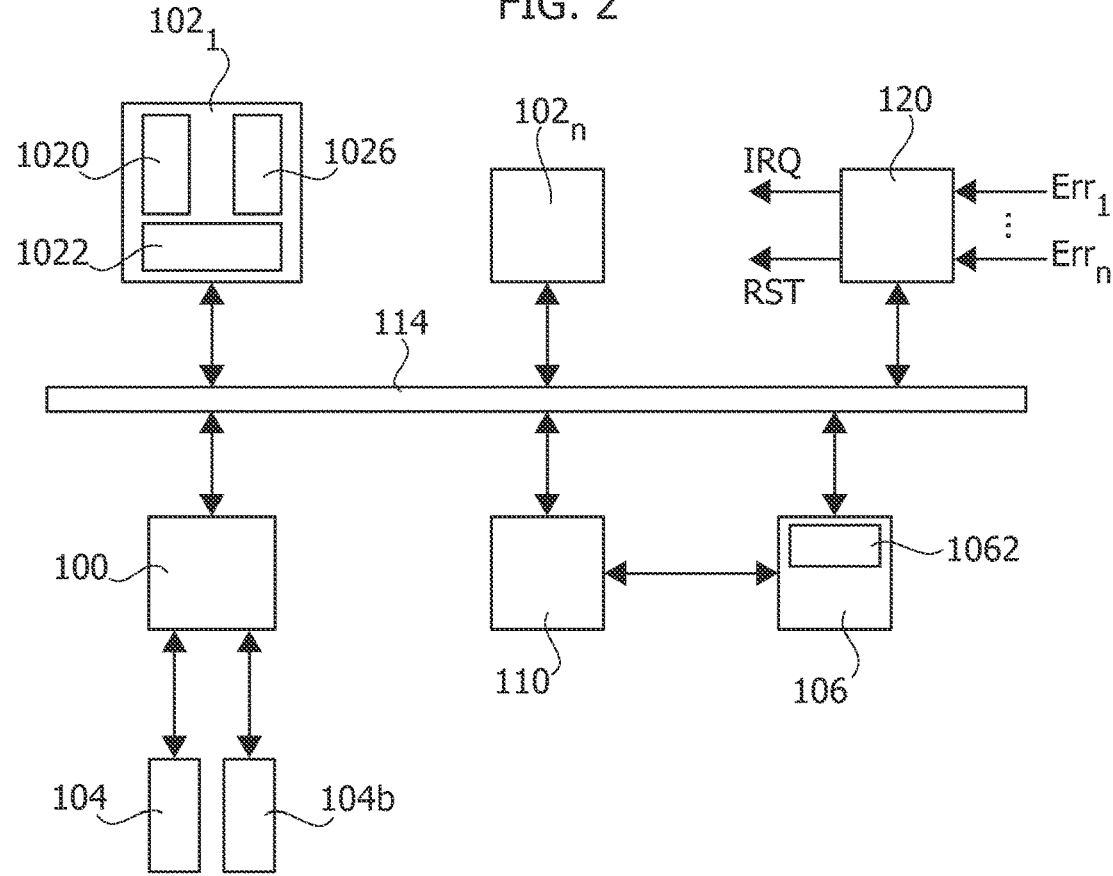
FIG. 2 shows an examples of processing systems.
Figure 3:
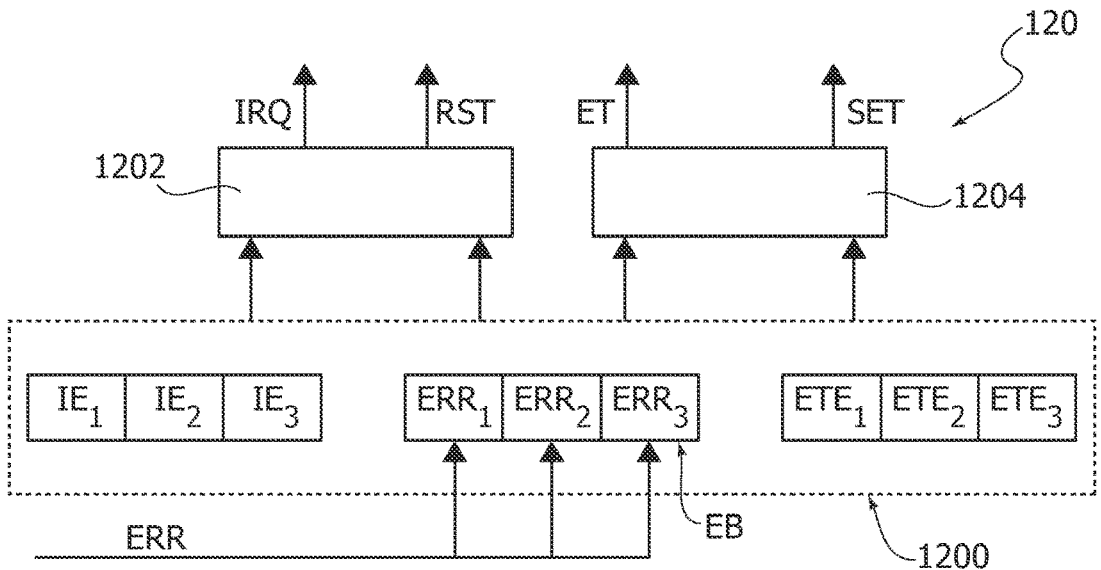
FIG. 3 shows an example of the fault collection and error management circuit of FIG. 2.
Figure 4:
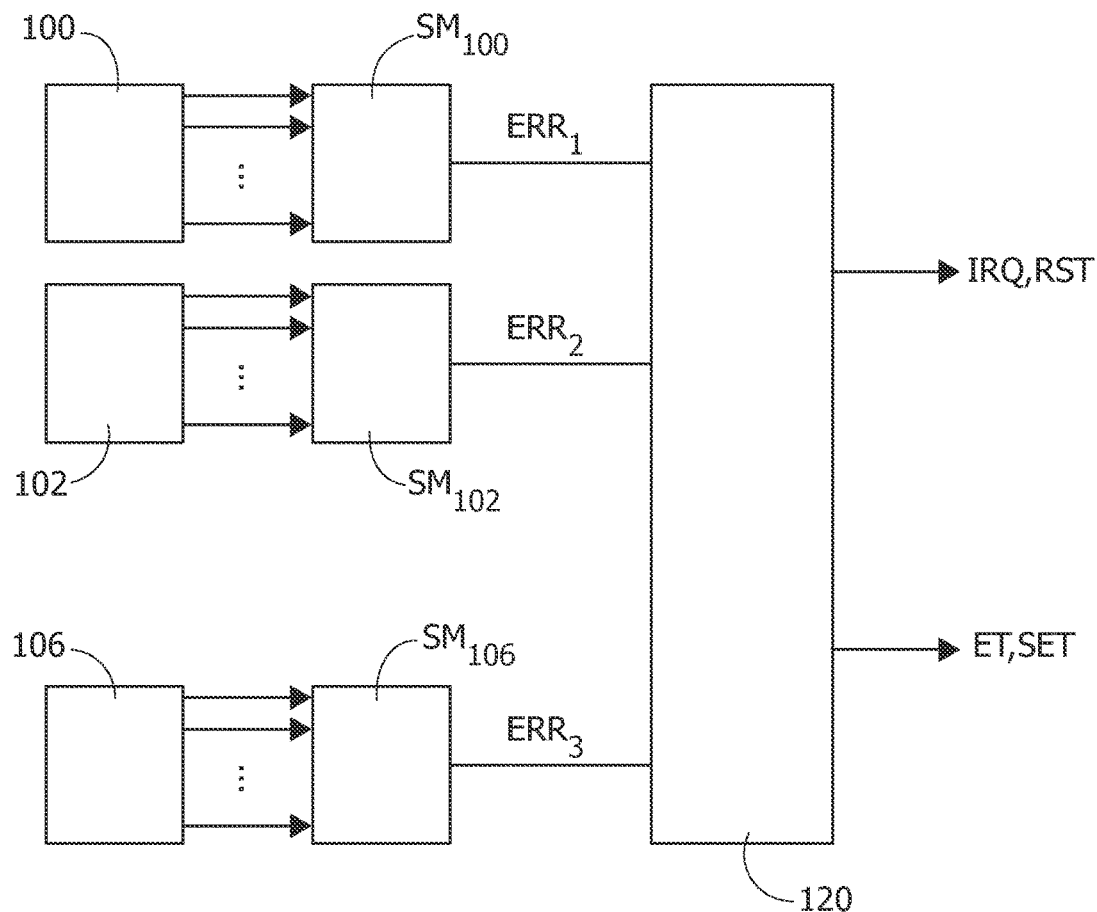
FIG. 4 shows an example of the connection between a plurality of safety monitoring circuits and the fault collection and error management circuit.
Figure 5:
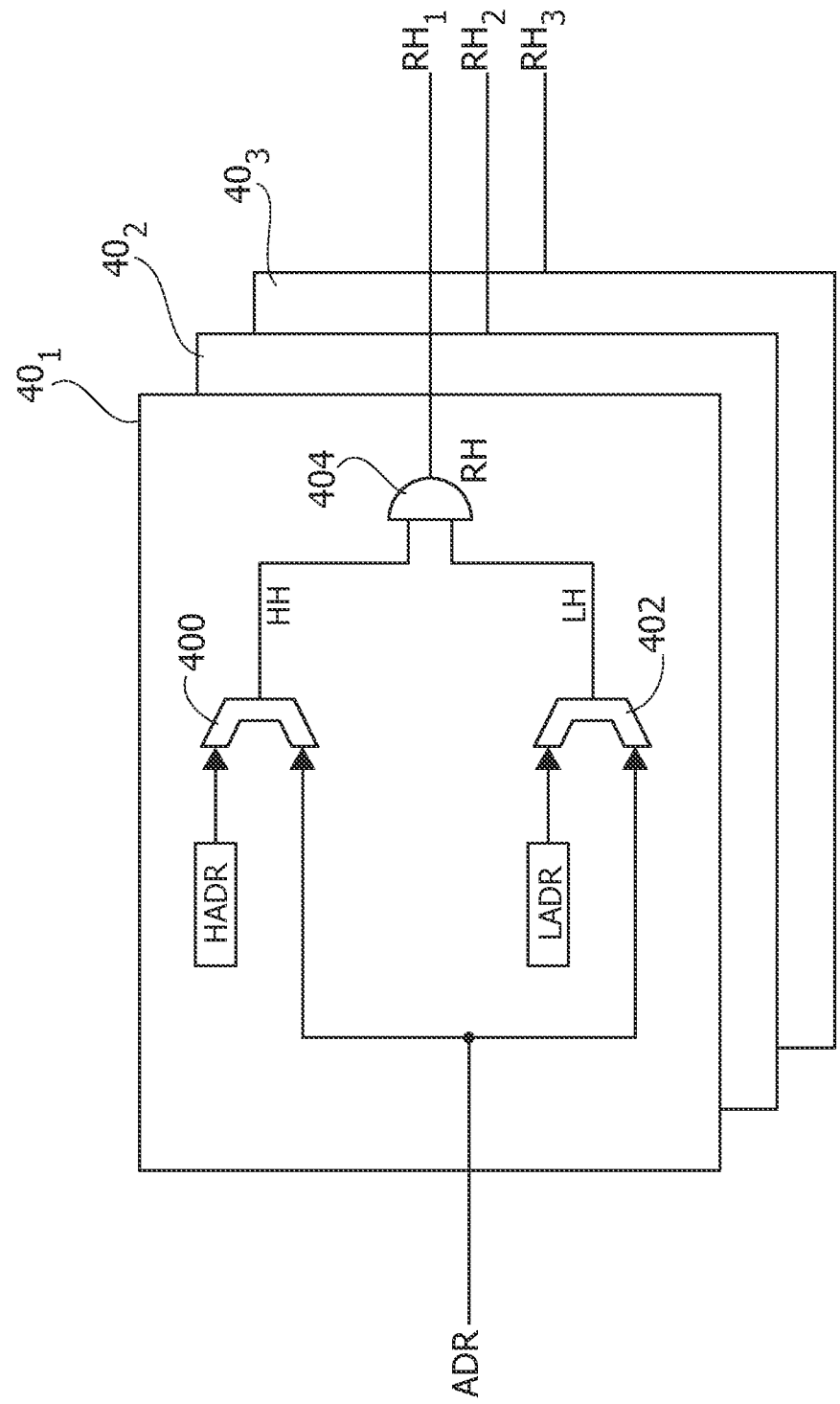
FIG. 5 shows an example of an address comparison circuit comprising an upper-limit comparator and a lower-limit comparator.

FIG. 5 shows an embodiment of an address comparison circuit 40 configured to receive an address signal ADR. For example, the address signal ADR may correspond to an address of the communication system 114, of a memory 104 or 104b, or any other address signal, such as an internal address signal of a processing core 102, e.g., used to interface the TCM 102$_6$ or for providing read or write requests to a memory protection unit of the processing core. For example, in the embodiment considered, the address comparator circuit 40 may form part of a set of address comparison circuits 40, such as circuits 40$_1$, 40$_2$ and 40$_3$.

In the embodiment considered, each address comparison circuit 40 is configured to compare the value of an address signal ADR with a respective (e.g., programmable) upper address limit HADR and a respective (e.g., programmable) lower address limit LADR in order to:

assert a respective range hit signal RH, such as signals RH$_1$, RH$_2$ and RH$_3$ for the circuits 40$_1$, 40$_2$ and 40$_3$, in response to determining that the value of the address signal ADR is between the upper address HADR and the lower address LADR; and de-assert the respective range hit signal RH in response to determining that the value of the address signal ADR is greater than the upper address HADR or smaller than the lower address LADR.

Generally, the signal RH may be asserted by setting the signal RH to high, e.g., in order to indicate a positive address hit, or to low, e.g., in order to indicate a negative address hit.

For example, in the embodiment considered, each address comparison circuit 40 comprises a first digital comparator 400 configured to compare the value of the address signal ADR with the respective upper address limit HADR and:

in response to determining that the value of the address signal ADR is smaller than the upper address limit HADR, assert a respective signal HH; and in response to determining that the value of the address signal ADR is greater than the upper address limit HADR, de-assert a respective signal HH.

Generally, based on the application and as will be described in greater detail in the following, the digital comparator 400 may be configured to assert or de-assert the signal HH when the address signal ADR corresponds to the upper address HADR.

Similarly, each address comparison circuit 40 comprises a second digital comparator 402 configured to compare the value of the address signal ADR with the respective lower address limit LADR and:
- in response to determining that the value of the address signal ADR is greater than the lower address limit LADR, assert a respective signal LH; and
- in response to determining that the value of the address signal ADR is smaller than the lower address limit LADR, de-assert a respective signal LH.

Based on the application, the digital comparator 402 may be configured to assert or de-assert the signal LH when the address signal ADR corresponds to the lower address limit LADR.

Accordingly, in the embodiment considered, each address comparison circuit 40 comprises a combinational logic circuit 404, such as a logic gate, configured to assert the respective signal RH when the signals HH and LH are asserted. For example, assuming that the signals HH, LH and RH are asserted by setting the respective signal to high, the combinational logic circuit 404 may be implemented with a logic AND gate.

In this respect, the standard ISO26262 prescribes that any error detection logic should be protected in terms of fault. The level of protection depends on how safety-critical is the function whose eventual errors are captured by this error detection logic: in the most stringent scenario, corresponding to the ASIL-D level of the ISO26262 specification, the error detection logic shall have a fault coverage of a minimum of 90% of all possible errors.

The inventors have observed that the verification/coverage of an address verification circuit could be implemented with different strategies, such as:
- running a LBIST (Logic Built-In Self-Test), which is a way to stimulate the internal nodes of the safety monitor circuit and verifying the result and/or by duplicating the address comparison circuit and checking that both circuits provide the same output; and/or
- running some specific software aimed to stimulate the logic functionality, e.g., by setting different address comparison ranges and providing requests comprising different addresses.

However, the inventors have observed that these solutions have advantages and disadvantages, such as:
- The LBIST solution requires an effort in back-end development stage, which can consume resources and project time, as the LBIST coverage might be obtained only after several time-consuming trials. Moreover, in order to reach the target coverage, it is necessary to insert LBIST test points, which also means an increase in area. Additionally, the test time to achieve the target coverage may be high.
- Duplicating the logic circuit increases the device area and require one more safety monitor to check the output of the duplicated safety monitors.
- A SW test may not be practical, because the number of tests may be very high so that the time to complete them is also exceeding eventual test-time budget constraint (which are often defined by the customer). Moreover, the complexity of the SW can represent an issue in terms of development, verification, and associated costs. Additionally, multiple instances of such comparison circuits may need be tested sequentially further increasing the test time.

Figure 6:
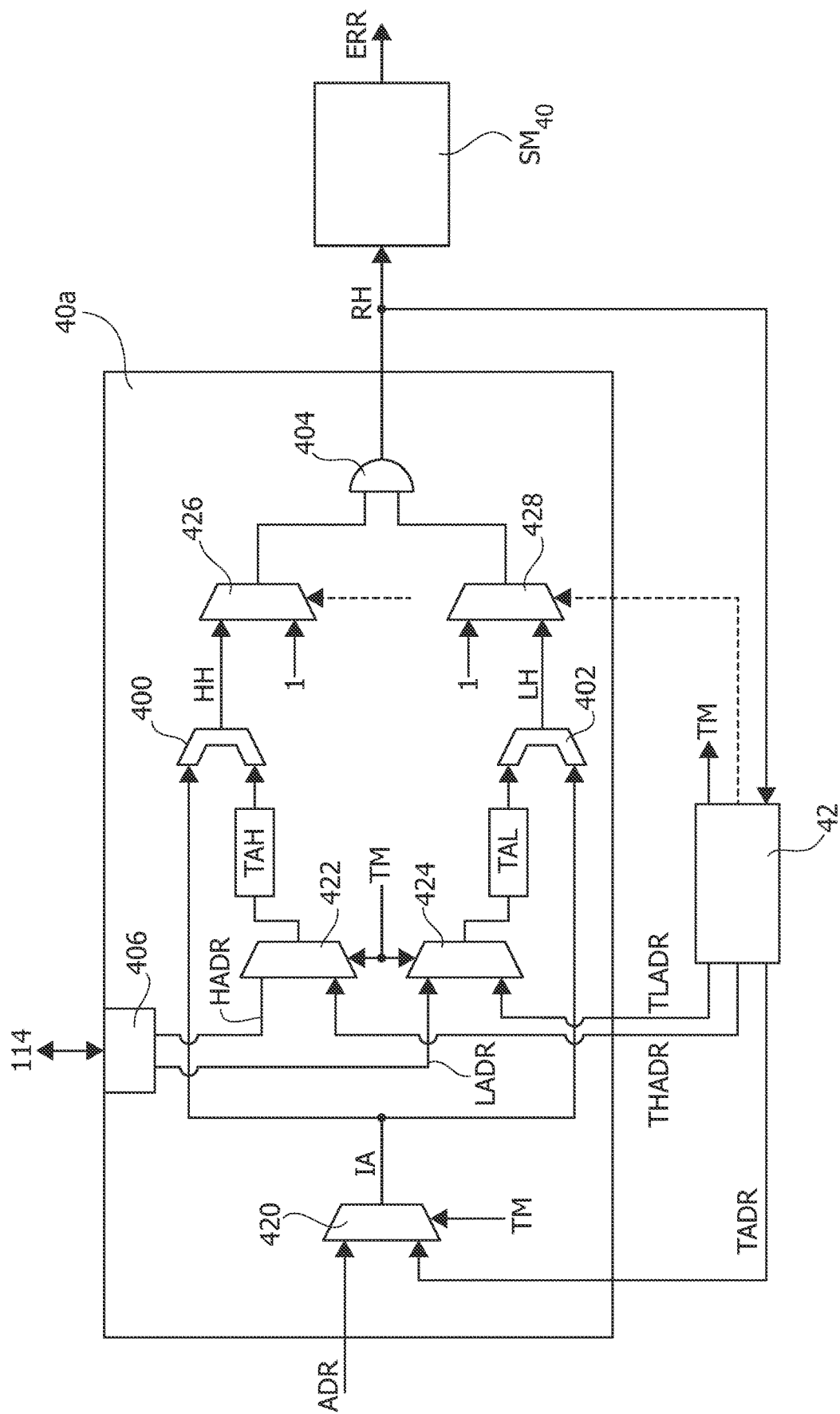
FIG. 6 shows an embodiment of a modified address comparison circuit having associated a test circuit.

FIG. 6 shows an embodiment of a modified address comparison circuit 40a.

Specifically, in the embodiment considered, the address comparison circuit 40a comprises a multiplexer 420 configured to provide an address signal IA by selecting the address signal ADR or a test address signal TADR as a function of a signal TM, wherein the test address signal TADR is provided by a test circuit 42, i.e., the test circuit 42 is configured to selectively provide the address signal IA to the address comparison circuit 40a.

In the embodiment considered, the address comparison circuit 40a comprises two further multiplexers 422 and 424. Specifically, the multiplexer 422 is configured to provide an upper address limit or threshold TAH by selecting the upper address HADR, e.g., provided by a register interface 406, or an upper address THADR (corresponding to a test upper address limit) as a function of a signal TM. Similarly, the multiplexer 424 is configured to provide a lower address limit or threshold TAL by selecting a lower address LADR, e.g., provided by a register interface 406, or a second lower address TLADR (corresponding to a test lower address limit) as a function of a signal TM. Accordingly, the addresses THADR and TLADR may be provided by the test circuit 42. As will be described in greater detail in the following, in various embodiments, the test circuit 42 may also provide a common limit signal TRADR, with THADR=TLADR=TRADR.

Generally, the lower address LADR and/or the upper address HADR may also be fixed or programmable in any other suitable manner, and the use of a register interface 406 refers just to a typical application. For example, the register interface 406 may comprise registers for storing the respective upper address limit HADR and the respective lower address limit LADR, wherein these registers are programmable, e.g., by sending commands to the communication system 114 and/or a communication system within a processing core 102 (e.g., used to configure a memory protection unit).

In the embodiment considered, the comparator 400 is thus configured to assert the signal HH when the address signal IA is smaller than the upper address TAH and the comparator 402 is configured to assert the signal LH when the address signal IA is greater than the lower address TAL. Generally, the address signal ADR (and accordingly also the signals TADR, IA, HADR, THADR, TAH, LADR, TLADR, TAL) has thus a given number N of bits, such as 16, 32 or 62 bits.

In the embodiment considered, the test circuit 42 may thus drive the multiplexers 420, 422 and 424 via the signal TM in order to provide during a test mode (e.g., the signal TM is set to high) the address signal TADR and the upper and lower-limits THADR and TLADR to the digital comparators 400 and 402, respectively.

In various embodiments, the address comparison circuit 40a comprises also two further combinational logic circuit 426 and 428. Specifically, the combinational logic circuit 426, schematically shown via a multiplexer, is configured to selectively assert/mask the signal HH provided to the combinational logic circuit 404, e.g., by setting the signal HH to high. Similarly, the combinational logic circuit 428, schematically shown via a multiplexer, is configured to selectively assert/mask the signal LH provided to the combinational logic circuit 404, e.g., by setting the signal LH to high. Accordingly, in this way, the test circuit 42 may also generate the selection signals for the combinational logic circuits 426 and 428 in order to selectively assert the signals HH and/or LH, irrespectively of the comparison result of the comparators 400 and/or 402.

As mentioned before, the comparison circuit 40a may form part, e.g., of a processing core 102, a memory controller 100, a resource 106 or also one or more of the safety-monitor circuits SM. For example, in FIG. 6 is also shown a safety-monitor circuit $SM_{40}$ configured to receive the signal RH and selectively assert an error signal ERR as a function of the signal RH, wherein the error signal ERR is provided the fault collection and error management circuit 120.

Accordingly, in the embodiment considered, the test circuit 42 may activate the test mode via the signal TM (used to switch the multiplexers 420, 422 and 424) and provide various combinations of signals TADR, THADR and TLADR to the comparison circuit 40a in order to test the comparison circuit 40a and provided a sufficient coverage of the test.

Figure 7:
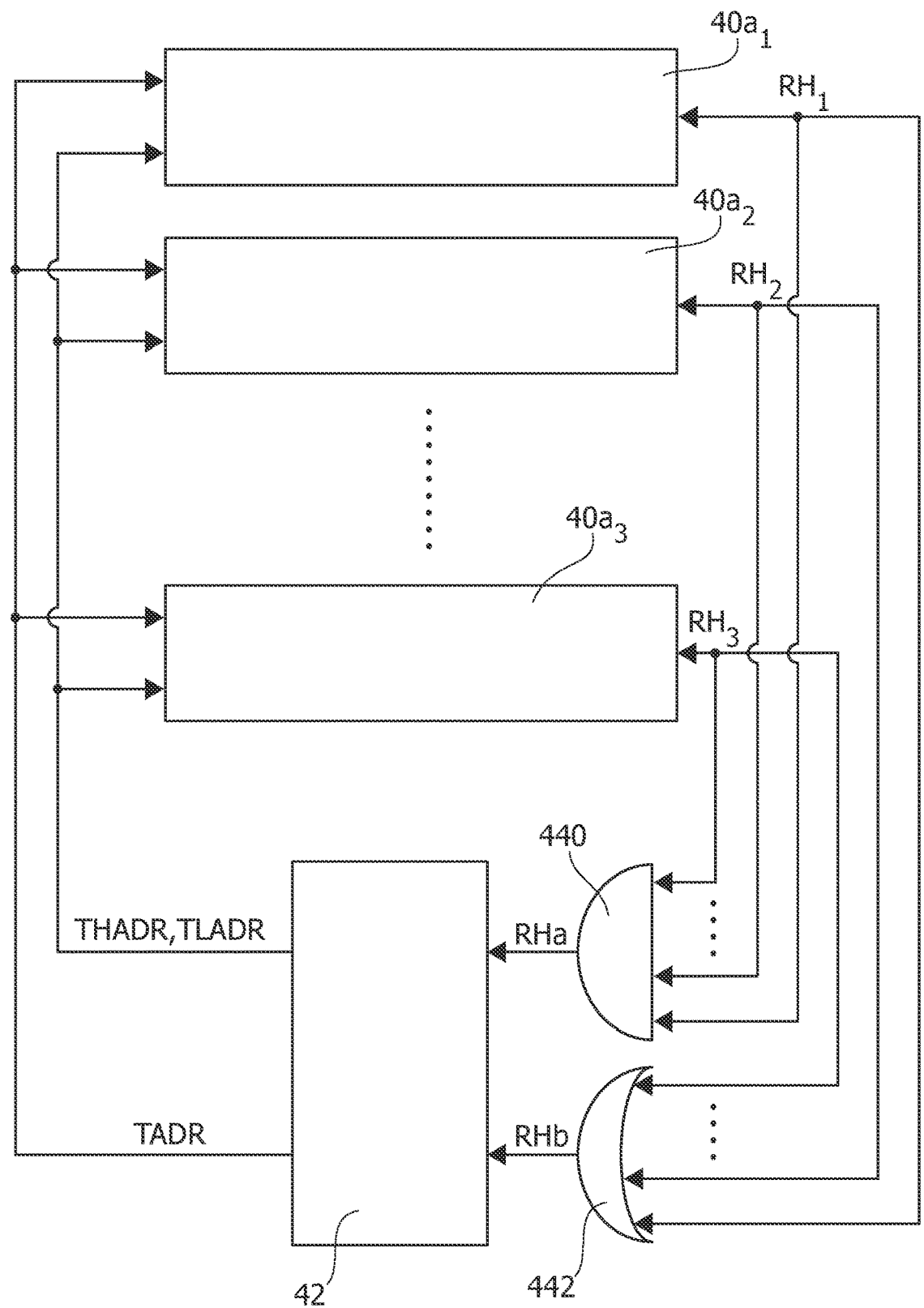
FIG. 7 shows an embodiment, wherein the test circuit may test a plurality of address comparison circuits.

As shown in FIG. 7, in various embodiments, the test circuit 42 may also test in parallel a plurality of comparison circuit 40a, e.g., comparison circuits $40a_1$, $40a_2$, and $40a_3$. In this case, apart from activating the test mode (via the signal TM) for the comparison circuits 40a, the test circuit 42 provides the same signals TADR, THADR and TLADR to the comparison circuits 40a. In order to monitor the range hit signal RH generated by the comparison circuits 40a, such as signals $RH_1$, $RH_2$ and $RH_3$, the test circuit 42 has associated (or comprises) two logic gates:

a first logic gate 440, such as an AND gate, configured to assert a first signal RHa when all range hit signal RH are asserted; and a second logic gate 442, such as an OR gate, configured to assert a second signal RHb when at least one range hit signal RH is asserted.

Accordingly, in case the range hit signals RH should be asserted (based on the signals TADR, THADR and TLADR), the test circuit 42 may verify whether the signal Rha is asserted. In fact, the signal Rha is de-asserted when at least one of the comparison circuits 40a does not assert the respective signal RH. Accordingly, in this case, in response to determining that the signal Rha is de-asserted, the test circuit 42 may signal an error.

Similarly, in case the range hit signals RH should be de-asserted (based on the signals TADR, THADR and TLADR), the test circuit 42 may verify whether the signal RHb is de-asserted. In fact, the signal RHb is asserted when at least one of the comparison circuits 40a asserts the respective signal RH. Accordingly, in this case, in response to determining that the signal RHb is asserted, the test circuit may signal an error.

Generally, the specific test sequences to be used to test the comparators 400 and 402 depend on the specific implementation of these comparators.

In this respect, the inventors have observed that the number of tests to be performed may be significantly reduced when using a specific architecture for the comparators.

Figure 8:
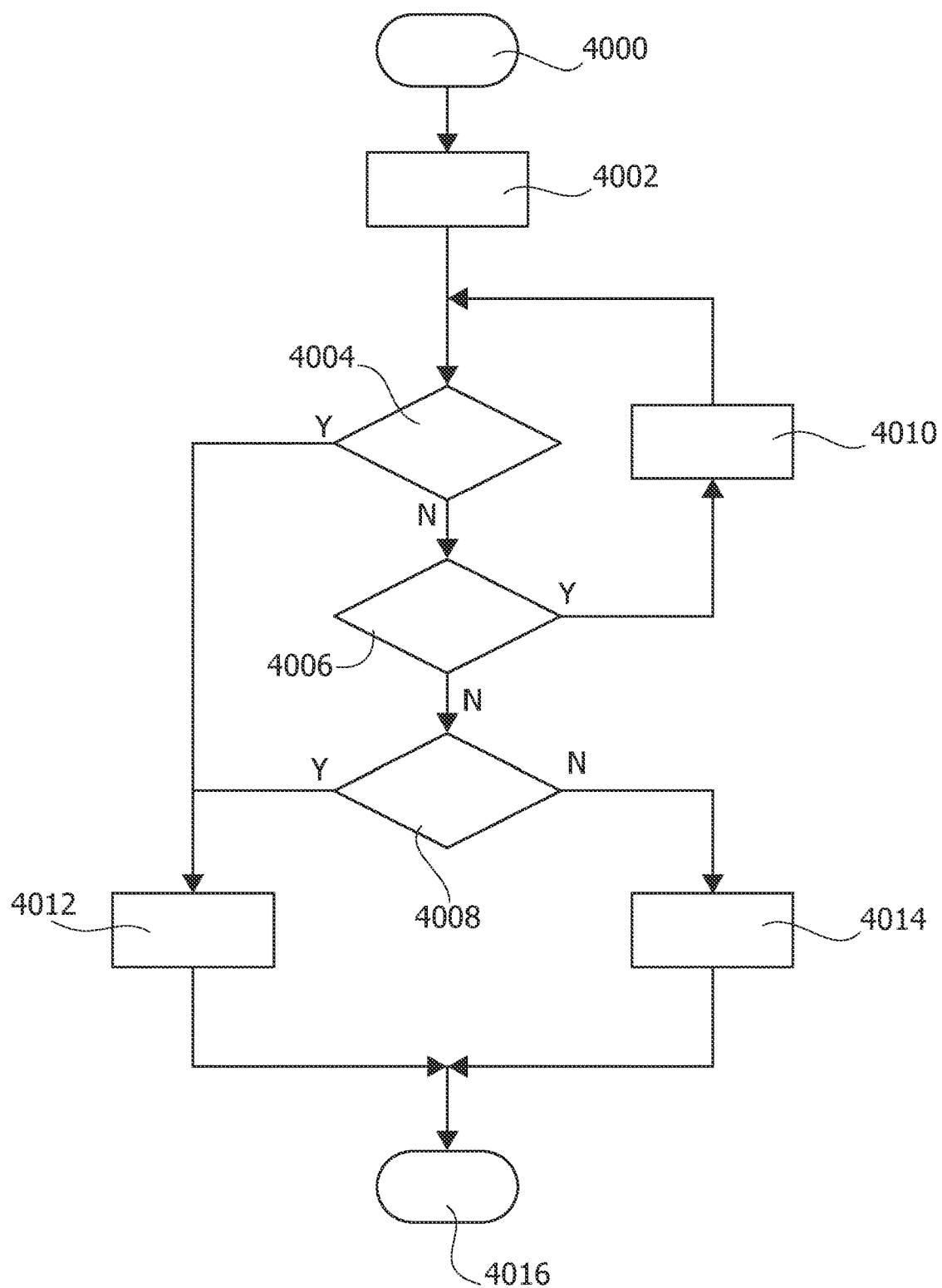
FIG. 8 shows an embodiment of the operation of an iterative upper-limit comparator.

FIG. 8 shows an embodiment of the operation of the comparator 400.

Specifically, the operation of the comparator 400 is started at a start step 4000, e.g., at each clock cycle or in response to a given request. At a following step 4002, the comparator 400 sets an index x to the index of the Most Significant Bit (MSB), e.g., x=N.

At a following step 4006, the comparator 400 verifies whether the bit value of the selected bit of the address signal IA[x] corresponds to the bit value of the selected bit of the address upper threshold TAH[x], i.e., IA[x]=TAH[x]. In case the value of the bit IA[x] does not correspond to the value of the bit TAH[x] (output "N" of the verification step 4006), the comparator 400 proceeds to a step 4008, where the comparator 400 verifies whether the value of the bit IA[x] is greater than the value of the bit TAH[x], i.e., IA[x]>TAH[x], e.g., whether the bit IA[x] is set to high and the bit TAH[x] is set to low.

In case the value of the bit IA[x] is greater than the value of the bit TAH[x] (output "Y" of the verification step 4008), the comparator 400 de-asserts the signal HH at a step 4012 and the operation stops at a stop step 4016. Conversely, in case the value of the bit IA[x] is smaller than the value of the bit TAH[x] (output "N" of the verification step 4008), the comparator 400 asserts the signal HH at a step 4014 and the operation stops at the stop step 4016.

Conversely, in case the value of the bit IA[x] corresponds to the value of the bit TAH[x] (output "Y" of the verification step 4006), the comparator 400 is unable to determine, based on the selected bit, whether the address IA is greater than the threshold TAH and has to check the next lower bit. Accordingly, in this case, the comparator 400 selects at a step 4010 the next lower bit, i.e., x=x−1, and returns to the step 4006 for verifying the next lower bit. For this reason, such a comparator architecture is usually identified as iterative comparator circuit.

In FIG. 8 is shown also a verification step 4004. Specifically, this step verifies whether all bits have been verified, e.g., because the index is set to 0. Accordingly, in case not all bits have been verified (output "N" of the verification step 4004), the loop of the steps 4006 and 4010 may be repeated. Conversely, in case all bits have been verified (output "Y" of the verification step 4004), this implies that none of the bits IA[x] has been greater or smaller than the respective bit TAH[x], i.e., the address IA corresponds to the threshold TAH. Accordingly, in case this condition occurs, the comparator 400 may proceed to:

the step 4012 in case the threshold TAH is not included in the address range; or the step 4014 in case the threshold TAH is included in the address range.

Figure 9:
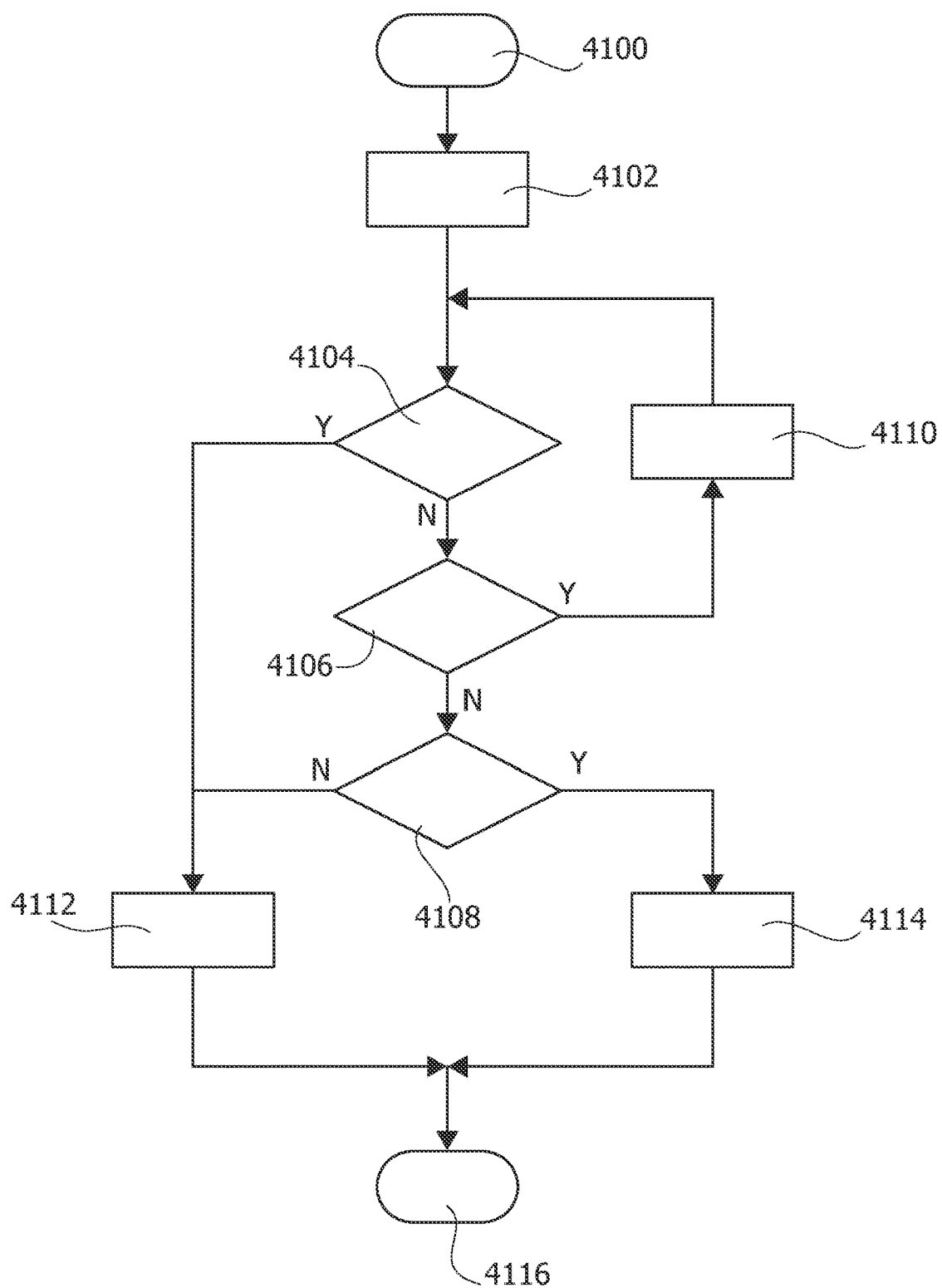
FIG. 9 shows an embodiment of the operation of an iterative lower-limit comparator.

Similarly, FIG. 9 shows an embodiment of the operation of the comparator 402.

Specifically, the operation of the comparator 402 is started at a start step 4100, e.g., at each clock cycle or in response to a given request. At a following step 4102, the comparator 402 sets an index x to the index of the Most Significant Bit (MSB), e.g., x=N.

At a following step 4106, the comparator 402 verifies whether the bit value of the selected bit of the address signal IA[x] corresponds to the bit value of the selected bit of the address lover threshold TAL[x], i.e., IA[x]=TAL[x]. In case the value of the bit IA[x] does not correspond to the value of the bit TAL[x] (output "N" of the verification step 4106), the comparator 402 proceeds to a step 4108, where the comparator 402 verifies whether the value of the bit IA[x] is greater than the value of the bit TAL[x], i.e., IA[x]>TAL[x], e.g., whether the bit IA[x] is set to high and the bit TAL[x] is set to low.

In case the value of the bit IA[x] is greater than the value of the bit TAL[x] (output "Y" of the verification step 4108), the comparator 402 asserts the signal LH at a step 4114 and the operation stops at a stop step 4116. Conversely, in case the value of the bit IA[x] is smaller than the value of the bit TAL[x] (output "N" of the verification step 4108), the comparator 402 de-asserts the signal LH at a step 4112 and the operation stops at the stop step 4116.

Also in this case, when the value of the bit IA[x] corresponds in the value of the bit LAH[x] (output "Y" of the verification step 4106), the comparator 402 is unable to determine, based on the selected bit, whether the address IA is greater than the threshold LAH and has to check the next lower bit. Accordingly, in this case, the comparator 402 selects at a step 4110 the next lower bit, i.e., x=x−1, and returns to the step 4106 for verifying the next lower bit.

Similarly, FIG. 9 shows an additional verification step 4104 used to verify whether all bits have been verified, e.g., because the index is set to 0. Accordingly, in case not all bits have been verified (output "N" of the verification step 4104), the loop of the steps 4106 and 4110 is repeated. Conversely, in case all bits have been verified (output "Y" of the verification step 4104), this implies that none of the bits IA[x] has been greater or smaller than the respective bit TAL[x], i.e., the address IA corresponds to the threshold TAL. Accordingly, in case this condition occurs, the comparator 402 may proceed to:

the step 4112 in case the threshold TAL is not included in the address range; or the step 4114 in case the threshold TAL is included in the address range.

Figure 10:
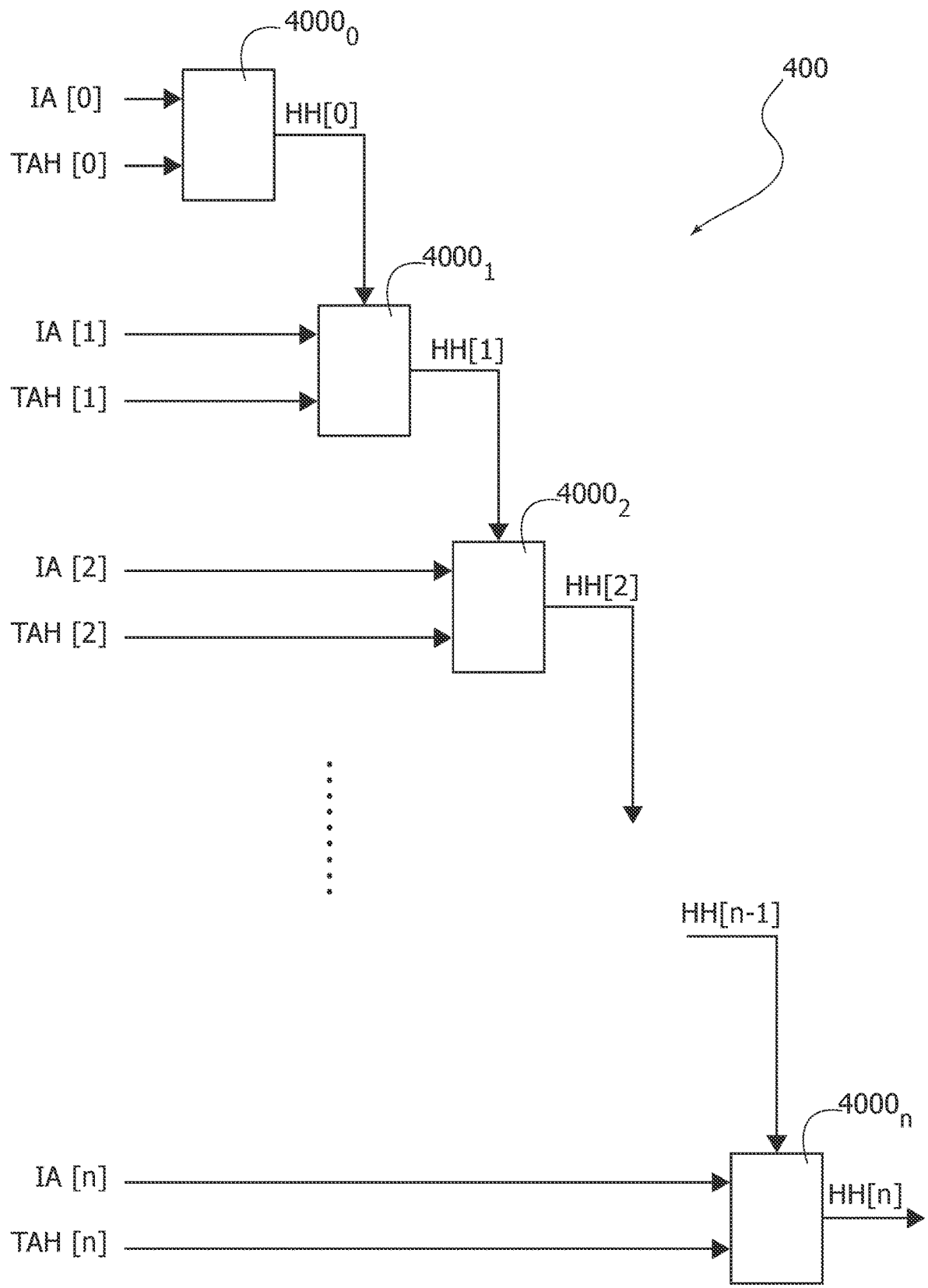
FIG. 10 shows an embodiment of the structure of an iterative upper-limit comparator.

FIG. 10 shows a possible hardware implementation of the operation of the comparator 400.

Specifically, in the embodiment considered, the iterative digital comparator 400 is implemented with a cascade of N bit-comparators $4000_0, \ldots, 4000_n$, with n=(N−1), wherein each bit-comparator $4000_i$, with 0≤i≤n, generates a respective comparison result HH[i] as a function of the respective bit IA[i] of the address signal IA, the respective bit TAH[i] of the upper address limit address signal TAH, and the comparison result HH[i−1] of the previous bit comparator $4000_{i-1}$.

In this respect, the signal HH is determined as a function of and preferably corresponds to the comparison result HH[n] of the last bit-comparator, i.e., HH=HH[n]. Moreover, the value HH[−1] received by the first bit comparator $4000_0$ may be set to "0", whereby the signal HH is asserted when the signal IA is smaller than the signal TAH, or "1", whereby the signal HH is also asserted when the signal IA corresponds to the signal TAH.

Specifically, in the embodiment considered, each bit comparator 4000 is configured to:

determine the logic values of the bits IA[i] and TAH[i] and in response to determining that the bit TAH[i] is set to high and the bit IA[i] is set to low, assert the signal HH[i];

in response to determining that the bit TAH[i] is set to low and the bit IA[i] is set to high, de-assert the signal HH[i]; and in response to determining that the bit TAH[i] is set to the value of the bit IA[i], set the signal HH[i] to the value of the signal HH[i−1] provided by the previous bit comparator $4000_{i-1}$.

For example, assuming that the signal IA is set to "100" and the signal TAH is set to "101", the bit comparators would provide the following output signals:

HH[0] would be set to "1", because the bit TAH[0] is set to high and the bit IA[0] is set to low;

HH[1] would be set to "1", because TAH[1]=IA[1] and HH[0] is set to high; and

HH[2]=HH would be set to "1", because TAH[2]=IA[2] and HH[1] is set to high.

Figure 11:
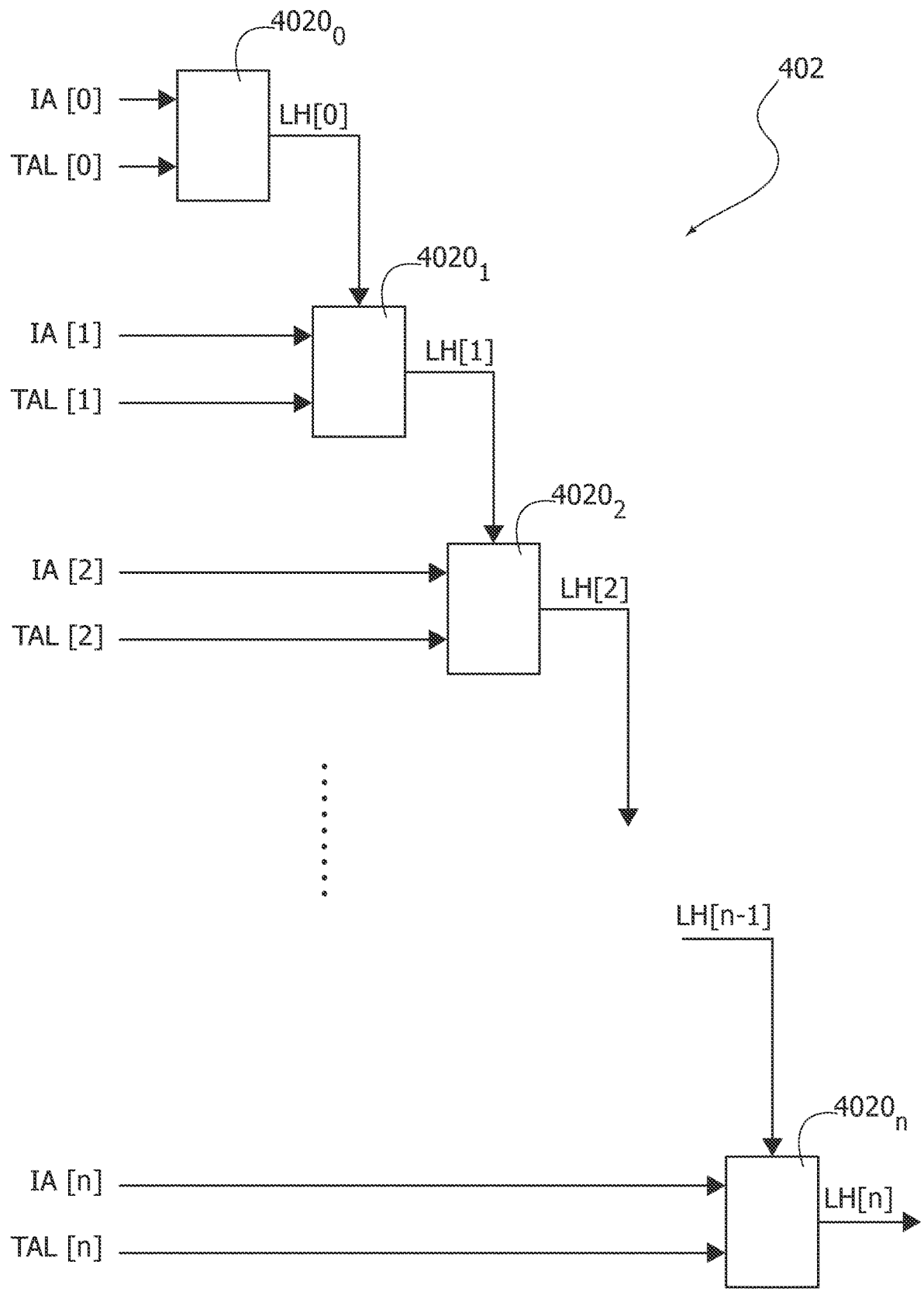
FIG. 11 shows an embodiment of the structure of an iterative lower-limit comparator.

Similarly, as shown in FIG. 11, the iterative digital comparator 402 may be implemented with a cascade of N bit-comparators $4020_0, \ldots, 4020_n$, with n=(N−1), wherein each bit-comparator $4020_i$, with 0≤i≤n, generates a respective comparison result LH[i] as a function of the respective bit IA[i] of the address signal IA, the respective bit TAL[i] of the lower address limit address signal TAH, and the comparison result LH[i−1] of the previous bit comparator $4020_{i-1}$.

In this respect, the signal LH is determined as a function of and preferably corresponds to the comparison result of the last bit-comparator, i.e., LH=LH[n]. Moreover, the value LH[−1] received by the first bit comparator $4020_0$ may be set to "0", whereby the signal LH is asserted when the signal IA is greater than the signal TAL, or "1", whereby the signal LH is also asserted when the signal IA corresponds to the signal TAL.

Specifically, in the embodiment considered, each bit comparator 4020 is configured to:

determine the logic values of the bits IA[i] and TAL[i] and in response to determining that the bit TAL[i] is set to high and the bit IA[i] is set to low, de-assert the signal LH[i];

in response to determining that the bit TAL[i] is set to low and the bit IA[i] is set to high, assert the signal LH[i]; and in response to determining that the bit TAL[i] is set to the value of the bit IA[i], set the signal LH[i] to the value of the signal LH[i−1] provided by the previous bit comparator $4020_{i-1}$.

For example, assuming that the signal ADR is set to "100" and the signal TAL is set to "011", the bit comparators would provide the following output signals:

LH[0] would be set to "0", because the bit TAL[0] is set to high and the bit IA[0] is set to low;

LH[i] would be set to "0", because the bit TAL[i] is set to high and the bit IA[i] is set to low;

LH[2] would be set to "1", because the bit TAL[2] is set to low and the bit IA[2] is set to high.

Accordingly, for the example of IA="100", TAH="101" and TAL="011", the comparator 400 may provide the signal HH="1" and the comparator 402 may provide the signal LH="1", whereby also the signal RH may be set to high, thereby indicating that the address IA is between the addresses TAH and TAL.

For example, the above behavior of the bit comparators may be expressed in the form of logic tables. For example, based on the implementation of the comparator 402, the value LH[−1] used by the first bit comparator $4020_0$ may be set to high or low, which may also be hardwired. Accordingly, when the comparator 402 is configured to determine whether the signal IA is greater than the signal TAL (LH[−1]="0"), the comparator $4020_0$ receiving the signals IA[0] and TAL[0] has the following logic table:

| IA[0] | TAL[0] | LH[0] |
|---|---|---|
| 0 | 0 | 0 |
| 0 | 1 | 0 |
| 1 | 0 | 1 |
| 1 | 1 | 0 |

Conversely, when the comparator 402 is configured to determine whether the signal IA corresponds to or is greater than the signal TAL (LH[−1]="1"), the comparator 4020 receiving the signals IA[0] and TAL[0] has the following logic table:

| IA[0] | TAL[0] | LH[0] |
|---|---|---|
| 0 | 0 | 1 |
| 0 | 1 | 0 |
| 1 | 0 | 1 |
| 1 | 1 | 1 |

Conversely, the bit comparators 40201 to 4020 receiving respective signals IA[i] and TAL[i] have the following logic table:

| IA[i] | TAL[i] | LH[i-1] | LH[i] |
|---|---|---|---|
| 0 | 0 | 0 | 0 |
| 0 | 0 | 1 | 1 |
| 0 | 1 | X | 0 |
| 1 | 0 | X | 1 |
| 1 | 1 | 0 | 0 |
| 1 | 1 | 1 | 1 |

Without lack of generality, in the following will be mainly assumed that the comparator 402 sets the signal LH[n] to high when IA≥TAL. In this case, the signal LH is thus asserted, e.g., set to high, when the signal LH[n] is set to high. Similarly, it will be assumed that the comparator 400 sets the signal HH[n] to high when IA≤TAH. In this case, the signal HH is thus asserted, e.g., set to high, when the signal HH[n] is set to high. Accordingly, the signal RH is asserted, e.g., set to high, when the TAL≤IA≤TAH, thereby indicating a positive hit.

As mentioned before, the test circuit 42 should thus provide sequentially different patterns via the signals TADR, TAH and TAL to the comparison circuit(s) 40a in order to test the comparators 400 and 402. For this purpose, the test circuit 42 may be implemented with a hardware sequential logic circuit, which thus implements a finite state machine.

Figure 12:
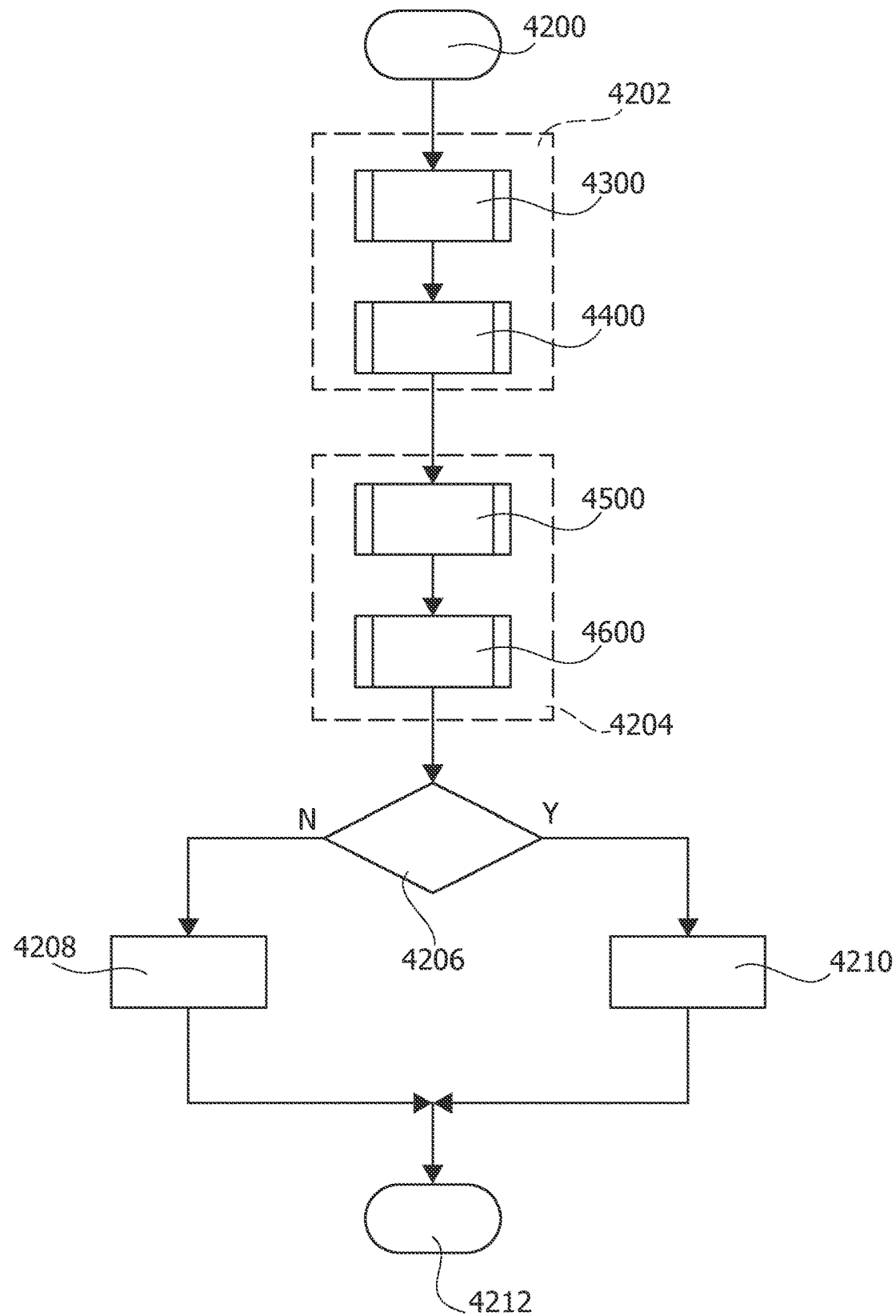
FIG. 12 shows an embodiment of the operation of the test circuit of FIG. 6.

FIG. 12 shows an embodiment of the operation of the test circuit 42 in order to test the address comparison circuit 40a.

Specifically, in the embodiment considered, after a start step 4200, the test circuit 42 is configured to test the comparators 400 and 402 separately. For this purpose, the test circuit may be configured to execute two phases, which may also be inverted:
- during a first test phase 4202, drive the combinational logic circuit 426 in order to assert the signal HH, whereby the test result of the comparator 400 is overwritten and the signal RH corresponds to the signal LH generated by the comparator 402, i.e., RH=LH; and
- during a second test phase 4204, drive the combinational logic circuit 428 in order to assert the signal LH, whereby the test result of the comparator 402 is overwritten and the signal RH corresponds to the signal HH generated by the comparator 400, i.e., RH=HH.

Accordingly, in various embodiments, the test circuit 42 may start the step 4200 in response to asserting the test mode signal TM, and once the test procedure is completed at a stop step 4212, the test circuit 42 may again de-assert the test mode signal TM.

The masking of the signals HH (during one phase) and LH (during the other phase) makes it possible to check the final signal RH at the output of the combinational logic circuit 404. Moreover, in this way, the signals THADR and TLADR may be combined, i.e., the test circuit 42 may provide a single address limit signal TRADR to the comparison circuit 40a, whereby when the test mode is activated, the upper and lower address limit TAH and TAL correspond to this address limit signal TRADR, i.e., TAH=TAL=TRADR, thereby reducing the wiring between the test circuit 42 and the various comparison circuits 40a.

However, in order to implement a faster test, also the signals HH and LH may be provided (directly, or similar to FIG. 7 via additional AND and OR gates) to the test circuit 42. Accordingly, in this case the comparators 400 and 402 may also be tested in parallel and the combinational logic circuits 426 and 428 could also be omitted, i.e., the phases 4202 and 4204 may be executed in parallel.

As shown in FIG. 12, in various embodiments, the test phase 4202 comprises two sub-phases or processes 4300 and 4400, which may also be inverted. Similarly, the test phase 4204 comprises two sub-phases or processes 4500 and 4600, which may also be inverted.

Figure 13:
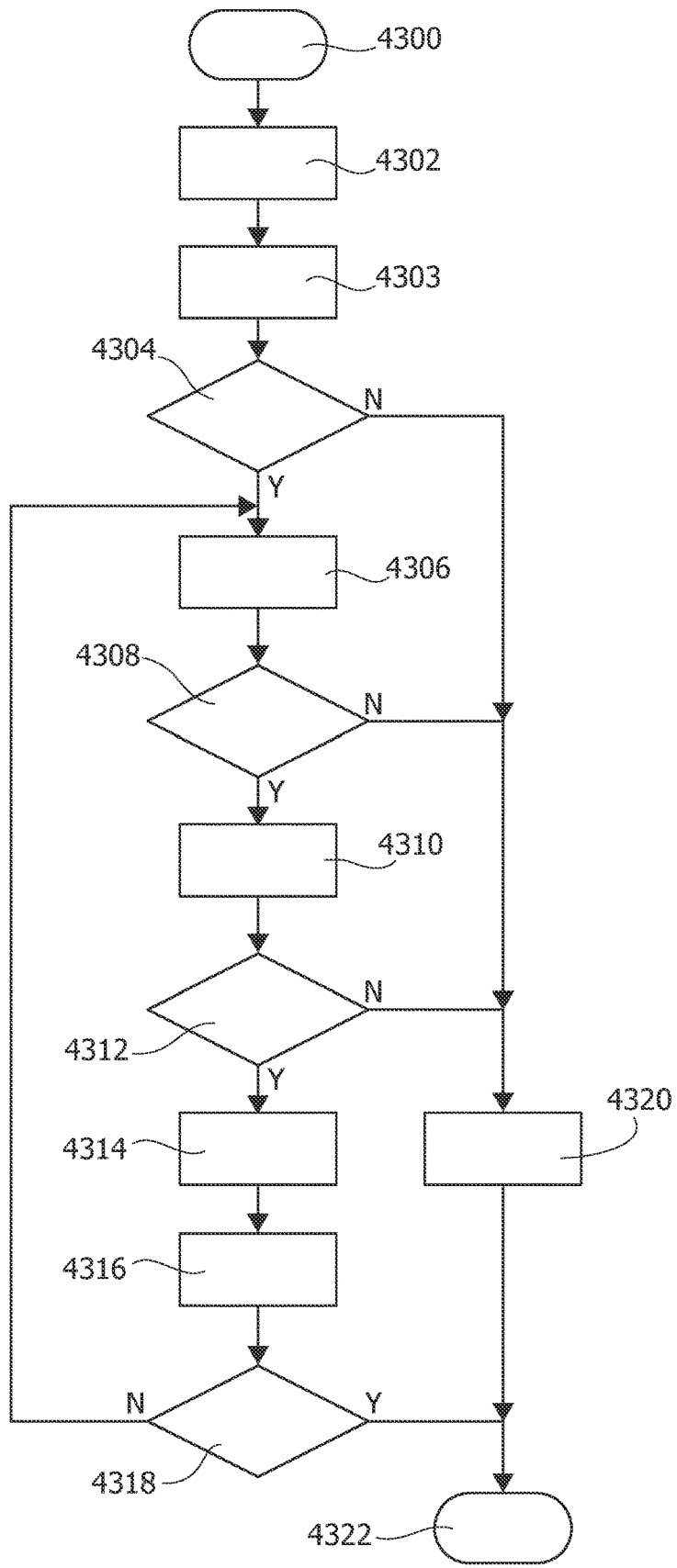
FIGS. 13-17 show embodiments of details of the operation of FIG. 12.

FIG. 13 shows an embodiment of the process 4300. Specifically, once the process 4300 is started, the test circuit 42 sets at a step 4302 all bits of the test address signal TADR (and thus the signal IA) and the lower address limit TAL (e.g., via the common signal TRADR) to "0".

Accordingly, the test 4302 verifies the comparison result when the comparator 402 receives IA=TAL, e.g., when the bit-comparators $4020_i$ receive IA[i]="0" and TAL[i]="0". Accordingly, based on the implementation of the comparator 402, the test circuit 42 may be configured to determine at a step 4304 whether the signal LH and/or RH corresponds to the expected result, i.e.:
- when the comparator 402 is configured to determine whether the address signal IA is greater than the lower address limit TAL, whether the signal LH (or preferably the signal RH in case of a masking of the signal HH) is de-asserted; or
- when the comparator 402 is configured to determine whether the address signal IA corresponds to or is greater than the lower address limit TAL, whether the signal LH (or preferably the signal RH in case of a masking of the signal HH) is asserted.

Accordingly, in case the signal LH and/or RH does not correspond to the expected result (output "N" of the verification step 4304, the test circuit 42 may proceed to an error step 4320 in order to signal that the test failed. Conversely, in case the signal LH and/or RH corresponds to the expected result (output "Y" of the verification step 4304, the test circuit 42 proceeds to a step 4306.

Specifically, in various embodiments, the test circuit sets at the step 4306 a given bit IA[i] to high and the respective bit TAL[i] to low, with 0≤i≤n. For example, as schematically shown in FIG. 13, the test circuit 42 may select the initial value of the index i at a step 4303, such as the Most Significant Bit (MSB) or the Least Significant Bit (lSB).

Accordingly, in this way, the signal LH should be set to high. Accordingly, the test circuit 42 may verify at a step 4308 whether the signal LH and/or RH is asserted (i.e., the comparator signals a hit). Accordingly, in case the signal LH (or RH) is de-asserted (output "N" of the verification step 4308), the test circuit proceeds to the error step 4320. Conversely, in case the signal LH and/or RH is asserted (output "Y" of the verification step 4308), the test circuit proceeds to a step 4310.

Specifically, in various embodiments, the test circuit sets at the step 4310 the bit IA[i] to low and the bit TAL[i] to high. Accordingly, in this way, the signal LH should be set to low. Accordingly, the test circuit 42 may verify at a step 4312 whether the signal LH and/or RH is de-asserted (i.e., the comparator signals a fail). Accordingly, in case the signal LH and/or RH is asserted (output "N" of the verification step 4312), the test circuit proceeds to the error step 4320.

Conversely, in case the signal LH and/or RH is de-asserted (output "Y" of the verification step 4312), the test circuit proceeds to a step 4314.

Specifically, at the step 4314, the test circuit 42 sets again the bit IA[i] to low and the bit TAL[i] to low.

Accordingly, at a step 4316, the test circuit 42 may select a further bit of the N bits to be tested, such as the next lower bit. Moreover, at a step 4318, the test circuit 42 may verify whether all N bits have been tested. Specifically, in case a further bit of the N bits has to be tested (output "N" of the verification step 4318), the test circuit 42 returns to the step 4306 for testing the next selected bit. Accordingly, in the embodiment considered, the test circuit 42 is configured to repeat the steps 4306-4314 for all N bits.

Conversely, in case the test circuit has tested all N bits (output "Y" of the verification step 4316), the test circuit 42 proceeds to a stop step 4322. Generally, the test circuit may also proceed from the error step 4320 to the stop step 4322.

Accordingly, the test 4300 verifies the operation of the comparator circuit 4020 starting from initial values IA and TAL having all bits set to "0".

Conversely, the test 4400 may verify the operation of the comparator 403 starting from initial values IA and TAL having all bits set to "1".

Figure 14:
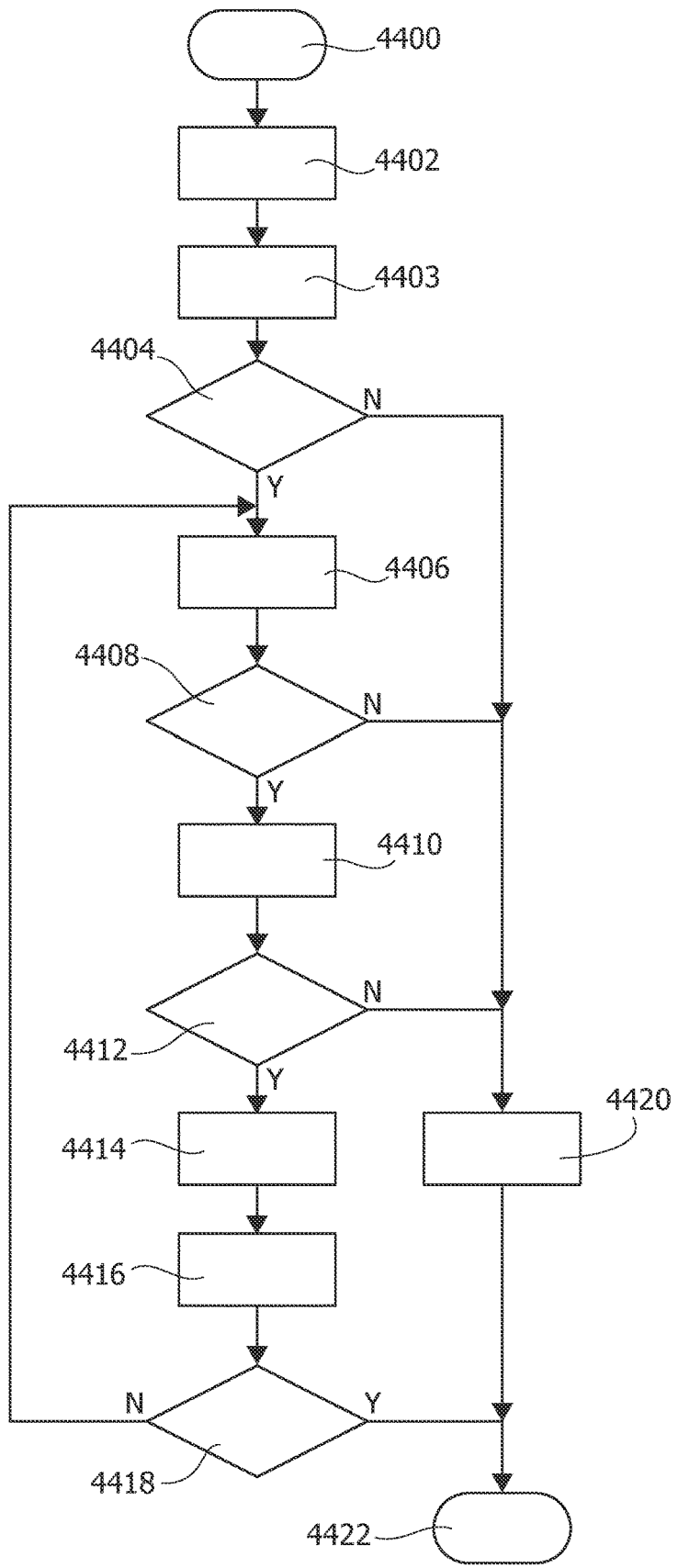

FIG. 14 shows an embodiment of the process 4400. Specifically, once the process 4400 is started, the test circuit 42 sets at a step 4402 all bits of the test address signal TADR (and thus the signal IA) and the lower address limit TAL (e.g., via the common signal TRADR) to "1".

Accordingly, the test 4402 verifies the comparison result when the comparator 402 receives IA=TAL, e.g., when the bit-comparators $4020_i$ receive IA[i]="1" and TAL[i]="1". Accordingly, based on the implementation of the comparator 402, the test circuit 42 may be configured to determine at a step 4404 whether the signal LH and/or RH corresponds to the expected result, i.e.:
- when the comparator 402 is configured to determine whether the address signal IA is greater than the lower address limit TAL, whether the signal LH (or preferably the signal RH in case of a masking of the signal HH) is de-asserted; or
- when the comparator 402 is configured to determine whether the address signal IA corresponds to or is greater than the lower address limit TAL, whether the signal LH (or preferably the signal RH in case of a masking of the signal HH) is asserted.

Accordingly, in case the signal LH and/or RH does not correspond to the expected result (output "N" of the verification step 4404, the test circuit 42 may proceed to an error step 4420 in order to signal an error, e.g., to the fault collection and error management circuit 120.

Conversely, in case the signal LH and/or RH corresponds to the expected result (output "Y" of the verification step 4404, the test circuit 42 proceeds to a step 4406.

Specifically, in various embodiments, the test circuit sets at the step 4406 a given bit IA[i] to high and the bit TAL[i] to low, with $0 \leq i \leq n$. For example, as schematically shown in FIG. 14, the test circuit 42 may select the initial value of the index i at a step 4403, such as the Most Significant Bit (MSB) or the Least Significant Bit (LSB).

Accordingly, in this way, the signal LH should be set to high. Accordingly, the test circuit 42 may verify at a step 4408 whether the signal LH and/or RH is asserted. Accordingly, in case the signal LH and/or RH is de-asserted (output "N" of the verification step 4408), the test circuit proceeds to the error step 4420. Conversely, in case the signal LH and/or RH is asserted (output "Y" of the verification step 4408), the test circuit proceeds to a step 4410.

Specifically, in various embodiments, the test circuit sets at the step 4410 the bit IA[i] to low and the bit TAL[i] to high. Accordingly, in this way, the signal LH should be set to low. Accordingly, the test circuit 42 may verify at a step 4412 whether the signal LH and/or RH is de-asserted. Accordingly, in case the signal LH and/or RH is asserted (output "N" of the verification step 4412), the test circuit proceeds to the error step 4420. Conversely, in case the signal LH and/or RH is de-asserted (output "Y" of the verification step 4412), the test circuit proceeds to a step 4414.

Specifically, at the step 4414, the test circuit 42 sets again the bit IA[i] to high and the bit TAL[i] to high.

Accordingly, at a step 4416, the test circuit 42 may select a further bit of the N bits such as the next lower bit. Moreover, at a step 4418, the test circuit 42 may verify whether all N bits have been tested. Specifically, in case a further bit of the N bits has to be tested (output "N" of the verification step 4418), the test circuit 42 returns to the step 4406 for testing the next selected bit. Accordingly, in the embodiment considered, the test circuit 42 is configured to repeat the steps 4406-4414 for all N bits.

Conversely, in case the test circuit has tested all N bits (output "N" of the verification step 4416), the test circuit 42 proceeds to a stop step 4422. Generally, the test circuit may also proceed from the error step 4420 to the stop step 4422.

In various embodiments, the test circuit 42 may implement corresponding operations also in order to test the comparator 400.

Figure 15:
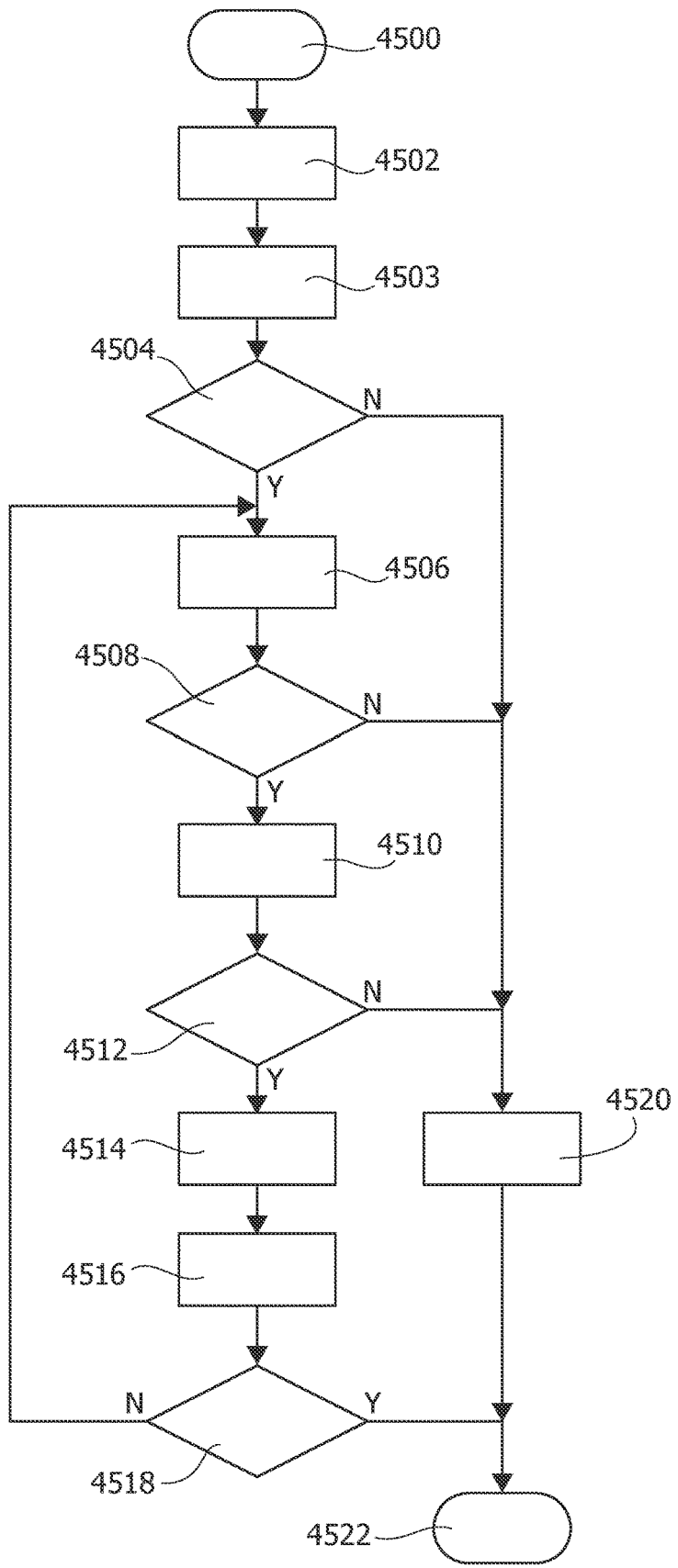

For example, as shown in FIG. 15, the process 4500 may essentially correspond to the process 4300 shown in FIG. 11, i.e., the test circuit 42 may set at a step 4502 all bits of the test address signal TADR (and thus the signal IA) and the upper address limit TAH (e.g., via the common signal TRADR) to "0". This test verifies thus the comparison result when the comparator 400 receives IA=TAL, e.g., when the bit-comparators 40001 receive IA[i]="0" and TAH[i]="0". Accordingly, based on the implementation of the comparator 400, the test circuit may verify at a step 4504 whether the signal HH and/or RH corresponds to the expected result, i.e.:
- when the comparator 400 is configured to determine whether the address signal IA is smaller than the upper address limit TAH, whether the signal HH (or preferably the signal RH in case of a masking of the signal LH) is de-asserted; or
- when the comparator 400 is configured to determine whether the address signal IA corresponds to or is smaller than the upper address limit TAH, whether the signal HH (or preferably the signal RH in case of a masking of the signal LH) is asserted.

Accordingly, in case the signal HH and/or RH does not correspond to the expected result, the test circuit 42 may signal an error at an error step 4520. Conversely, in case the signal HH and/or RH corresponds to the expected result, the test circuit 42 may sequentially select, e.g., via steps 4503, 4516 and 4518 (corresponding to steps 4303, 4316 and 4318), a given bit i, with $0 \leq i \leq n$, and:
- set at a step 4506 the bit IA[i] to high and the bit TAH[i] to low;
- verify at a step 4508 whether the signal HH and/or RH is de-asserted, and possibly signal an error at a step 4520 when the signal HH and/or RH is asserted;
- set at a step 4510 the bit IA[i] to low and the bit TAH[i] to high;

verify at a step 4512 whether the signal HH and/or RH is asserted, and possibly signal an error at the step 4520 when the signal HH and/or RH is de-asserted; and set at a step 4514 the bit IA[i] to low and the bit TAH[i] to low.

Figure 16:
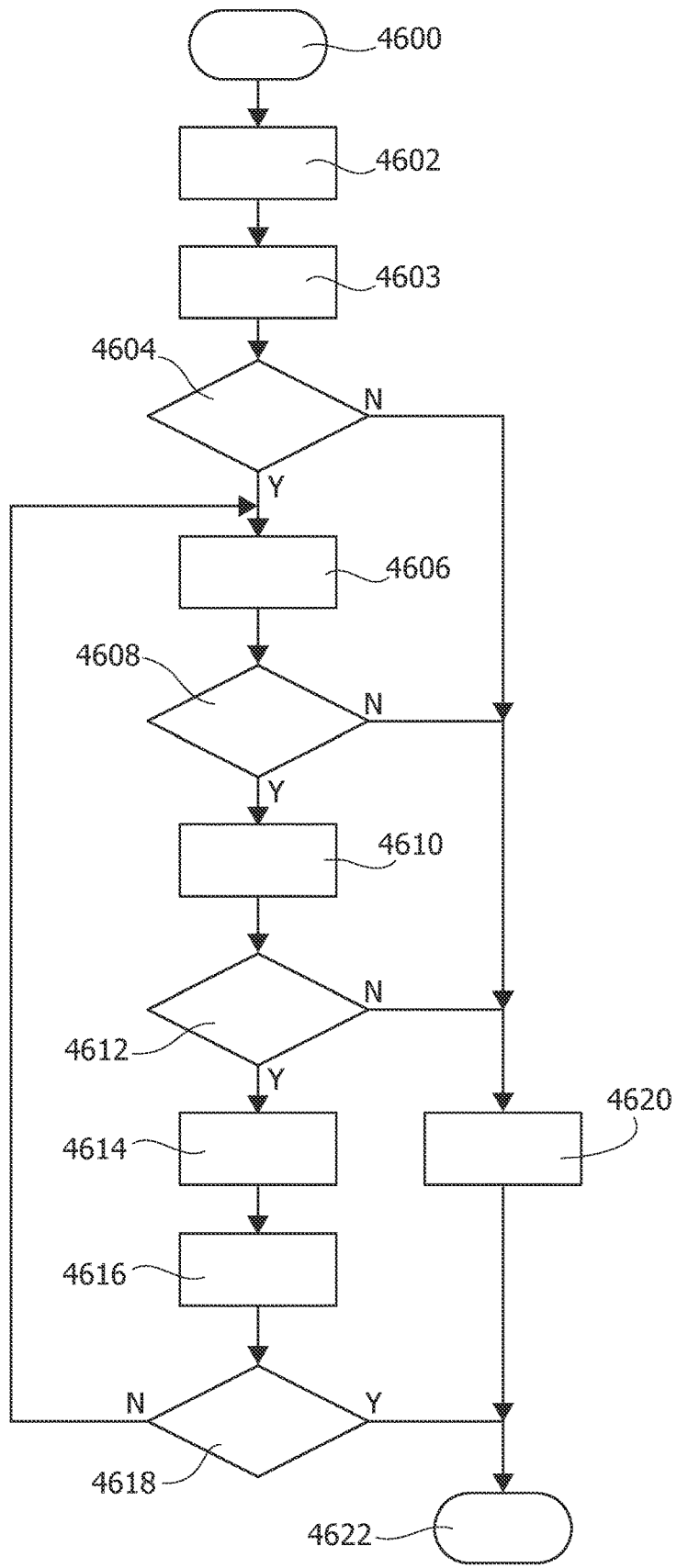

Conversely, as shown in FIG. 16, the process 4600 may essentially correspond to the process 4400 shown in FIG. 12, i.e., the test circuit 42 may set at a step 4602 all bits of the test address signal TADR (and thus the signal IA) and the upper address limit TAH (e.g., via the common signal TRADR) to "1". This test verifies thus the comparison result when the comparator 400 receives IA=TAI, e.g., when the bit-comparators 40001 receive IA[i]="1" and TAH[i]="1". Accordingly, based on the implementation of the comparator 400, the test circuit may verify whether the signal HH and/or RH corresponds to the expected result, i.e.:

when the comparator 400 is configured to determine whether the address signal IA is smaller than the upper address limit TAH, whether the signal HH (or preferably the signal RH in case of a masking of the signal LH) is de-asserted; or when the comparator 400 is configured to determine whether the address signal IA corresponds to or is smaller than the upper address limit TAH, whether the signal HH (or preferably the signal RH in case of a masking of the signal LH) is asserted.

Accordingly, in case the signal HH and/or RH does not correspond to the expected result, the test circuit 42 signal an error at an error step 4620. Conversely, in case the signal HH and/or RH corresponds to the expected result, the test circuit 42 may sequentially select, e.g., via steps 4603, 4616 and 4618 (corresponding to steps 4403, 4416 and 4418), a given bit i, with 0≤i≤n, and:

set at a step 4606 the bit IA[i] to high and the bit TAH[i] to low;

verify at a step 4680 whether the signal HH and/or RH is de-asserted, and possibly signal at the error step 4620 an error when the signal HH (or RH) is asserted;

set at a step 4612 the bit IA[i] to low and the bit TAH[i] to high;

verify whether the signal HH and/or RH is asserted, and possibly signal at the error step 4620 an error when the signal HH and/or RH is de-asserted; and set at a step 4614 the bit IA[i] to high and the bit TAH[i] to high.

Accordingly, in various embodiments, the processes 4300 and 4500, and similarly the processes 4400 and 4600, may generate the same signals TADR and THADR=TLADR, but may verify different results for the signal LH and HH. Accordingly, also in case parallel test are performed, in particular because the test circuit 42 receives also the signals HH and LH from the comparison circuit 40a, the test circuit 42 may be configured to generate the common signal TRADR=THADR=TLADR.

Accordingly, as shown in FIG. 12, once the tests 4202 and 4204 have been executed, the test circuit 42 may verify at a step 4206 whether one of the tests has signaled an error (see the steps 4320, 4420, 4520 and 4620). In case one of the tests has signaled an error (output "Y" of the verification step 4206), the test circuit may assert an error signal, which may be provided, e.g., to a processing core 102 and/or a fault collection and error management circuit 120. Conversely, in case none of the tests has signaled an error (output "N" of the verification step 4206), the test circuit may signal that the test of the comparator has been completed without errors, e.g., by de-asserting the error signal. Finally, the test terminates at a stop step 4212.

Generally, based on the application, the test circuit 42 may also be configured to execute just one of the tests 4300 and 4400 in order to test the comparator 402, and similarly one of the tests 4500 and 4600 in order to test the comparator 400.

Accordingly, in various embodiments, the test circuit 42 may be a configurable test circuit configured to execute one of the tests 4300, 4400, 4500 and/or 4600 as a function of one or more signals indicating which test should be executed, such as a first signal 0_1 indicating whether to start from bit sequences having all bits set to "0" or "1", and a second signal H_L indicating whether to test the comparator 400 or 402. For example, the combination of signals 0_1 and H_L may indicate whether to execute:

test 4300, e.g., when 0_1="0" and H_L="0";
test 4400, e.g., when 0_1="1" and H_L="0";
test 4500, e.g., when 0_1="0" and H_L="1"; and
test 4600, e.g., when 0_1="1" and H_L="1".

Figure 17:
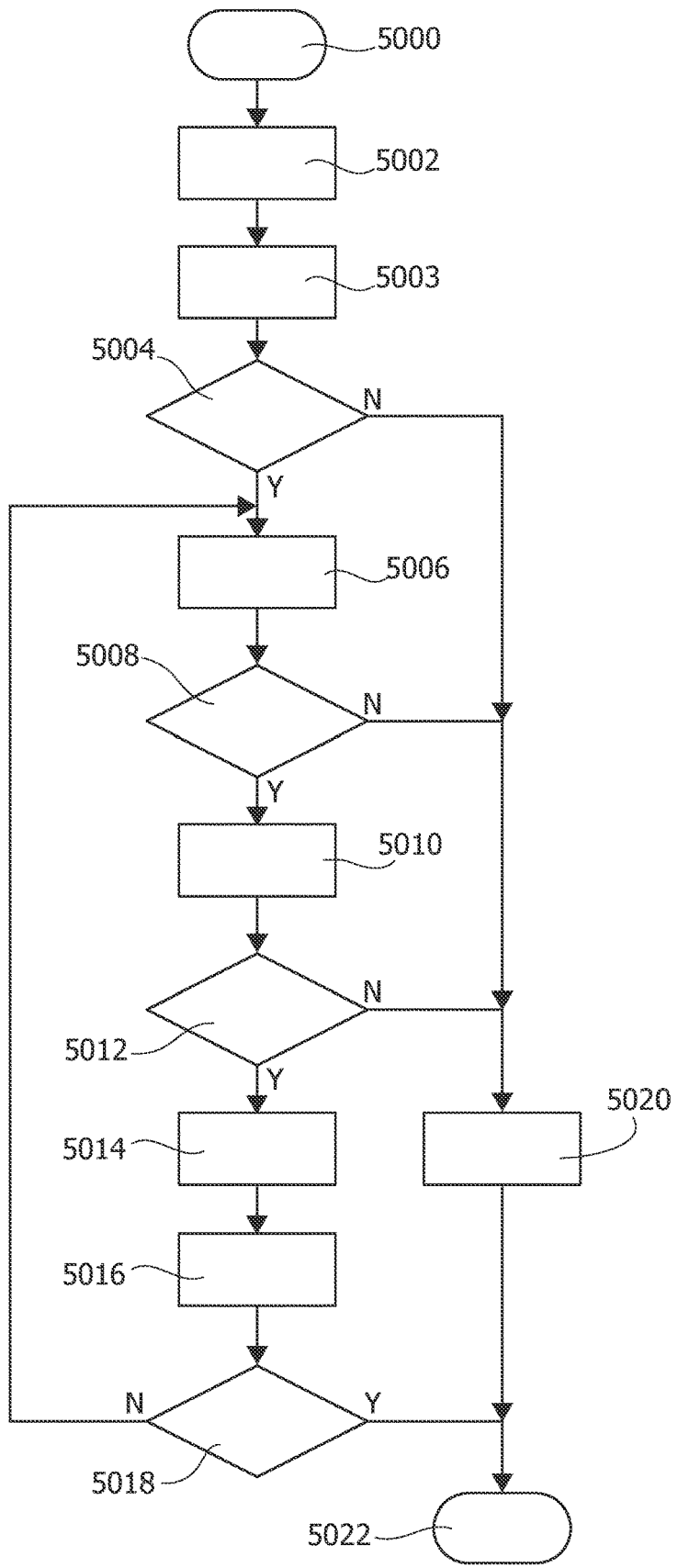

FIG. 17 shows an embodiment of the operation of the configurable test circuit 42.

In the following will now be assumed that the configurable test circuit supports all four tests. In this respect, as described in the foregoing, the process 4300 starts form initial bit sequences IA and TAL (via the signals TLADR or TRADR) having all bits set to "0", while the process 4400 starts form initial bit sequences IA and TAL having all bits set to "1". However, in both cases, the test circuit 42 expects the same results. Conversely, the processes 4500 and 4600 use the same initial bit sequences IA and TAH (via the signals THADR or TRADR), but expect a different result.

In the embodiment considered, after a start step 5000, the circuit 42 sets at a step 5002 (implementing the steps 4302, 4402, 4502 and 4602) all bits of the signals TADR and TRADR to the logic level of the signal 0_1, e.g., to "0" when the signal 0_1 is set to low and to "1" when the signal 0_1 is set to high. Generally, in various embodiments, the test circuit may use at the step 5002 also any other reference sequence, wherein the reference sequence may also depend on a selection signal, such as the signal 0_1. Accordingly, in this case, the test circuit 42 test the bits of the signals TADR and TRADR to the reference sequence.

For example, the configurable test circuit 42 may be configured to start the step 5000 in response to a request signal REQT. Moreover, when using the signal H_L, the test circuit 42 also masks one of the signals HH or LH as a function of the signal H_L. For example, in various embodiments, this signal may also be used to drive the combinational logic circuits 426 and 428. For example, during the test mode (e.g., the signal TM is set to high), the combinational logic circuit 426 may assert the signal HH when the signal H_L is set to low, thereby testing the low-level comparator 402, and the combinational logic circuit 428 may assert the signal LH when the signal H_L is set to high, thereby testing the high-level comparator 400.

Next, the circuit 42 verifies at a step 5004 (implementing the steps 4304, 4404, 4504 and 4604) whether the signal RH has a given expected logic level. As mentioned before, the expected logic level which may be either high (the signal IA may also correspond to the limit TAL/TAH) or low (the signal IA may not correspond to the limit TAL/TAH). Accordingly, in case the logic value of the signal RH is different from the expected logic level (output "N" of the verification step 5004), the circuit 42 proceeds to an error step 5020, e.g., used to assert a result signal RES.

Conversely, in case the logic value of the signal RH corresponds to the expected logic value level (output "Y" of the verification step 5004), the circuit 42 selects, e.g., at a step 5003, a given bit i, and sets at a step 5006 (implementing the steps 4306, 4406, 4506 and 4606) the bit TADR[i] to high and the bit TRADR[i] to low. Specifically, when the signal H_L is set to low (test of the lower-limit comparator 402), the signal RH should be asserted. Conversely, when the signal H_L is set to high (test of the upper level comparator 400), the signal RH should be de-asserted. Accordingly, the circuit 42 may verify at a step 5008 (implementing the steps 4308, 4408, 4508 and 4608) whether the signal RH corresponds to the inverted version of the signal H_L. Specifically, in case the logic value of the signal RH is corresponds to the logic value of the signal H_L (output "N" of the verification step 5008), the circuit 42 proceeds to the error step 5020.

Conversely, in case the logic value of the signal RH is different from the logic value of the signal H_L (output "Y" of the verification step 5008), the circuit 42 sets at a step 5010 (implementing the steps 4310, 4410, 4510 and 4610) the bit TADR[i] to low and the bit TRADR[i] to high. Specifically, when the signal H_L is set to low (test of the lower-limit comparator 402), the signal RH should be de-asserted. Conversely, when the signal H_L is set to high (test of the upper level comparator 400), the signal RH should be asserted.

Accordingly, the circuit 42 may verify at a step 5012 (implementing the steps 4312, 4412, 4512 and 4612) whether the signal RH correspond to the signal H_L. Specifically, in case the logic value of the signal RH is different from the logic value of the signal H_L (output "N" of the verification step 5012), the circuit 42 proceeds to the error step 5020. Conversely, in case the logic value of the signal RH corresponds to the logic value of the signal H_L (output "Y" of the verification step 5012), the circuit 42 sets at a step 5014 (implementing the steps 4314 and 4414) the bit TADR[i] and the bit TRADR[i] to the logic level of the signal 0_1.

Accordingly, the configurable test circuit 42 may select at a step 5016 (implementing the steps 4316, 4416, 4516 and 4616) a further bit and verify at a step 4018 (implementing steps 4318, 4418, 4518 and 4618) whether a further bit of the N bits has to be tested. Specifically, in case a further bit of the N bits has to be tested (output "N" of the verification step 5018), the test circuit 42 returns to the step 5006. Conversely, in case the test circuit has tested all N bits (output "Y" of the verification step 5018), the test circuit 42 proceeds to a stop step 5022, where the circuit 42 asserts a completion signal DONE. Generally, the test circuit may also proceed from the error step 5020 to the stop step 5022.

Generally, also any other bit value could be used at the step 5016, as long as the test circuit 42 sets the bit TADR[i] to the same logic level as the bit TRADR[i]. Thus, in the embodiments considered, the test circuit sets at the step 5002 the signals IA, TAL and TAH to the same value, modifies then at the steps 5006 and 5008 temporarily the signals in order to verify whether the signal RH is set once to high and once to low, and then sets the signals IA, TAL and TAH again to the same value. Accordingly, the verification step 5004 may be provided at the beginning (after the step 5002), at the end (before the step 5022) and/or even within the loop, e.g., after the step 5016 or before the step 5006). However, the use of the bit sequences described in the foregoing, have the advantage that the various tests may be requested based on a signal 0_1 just having a single bit.

Figure 18:
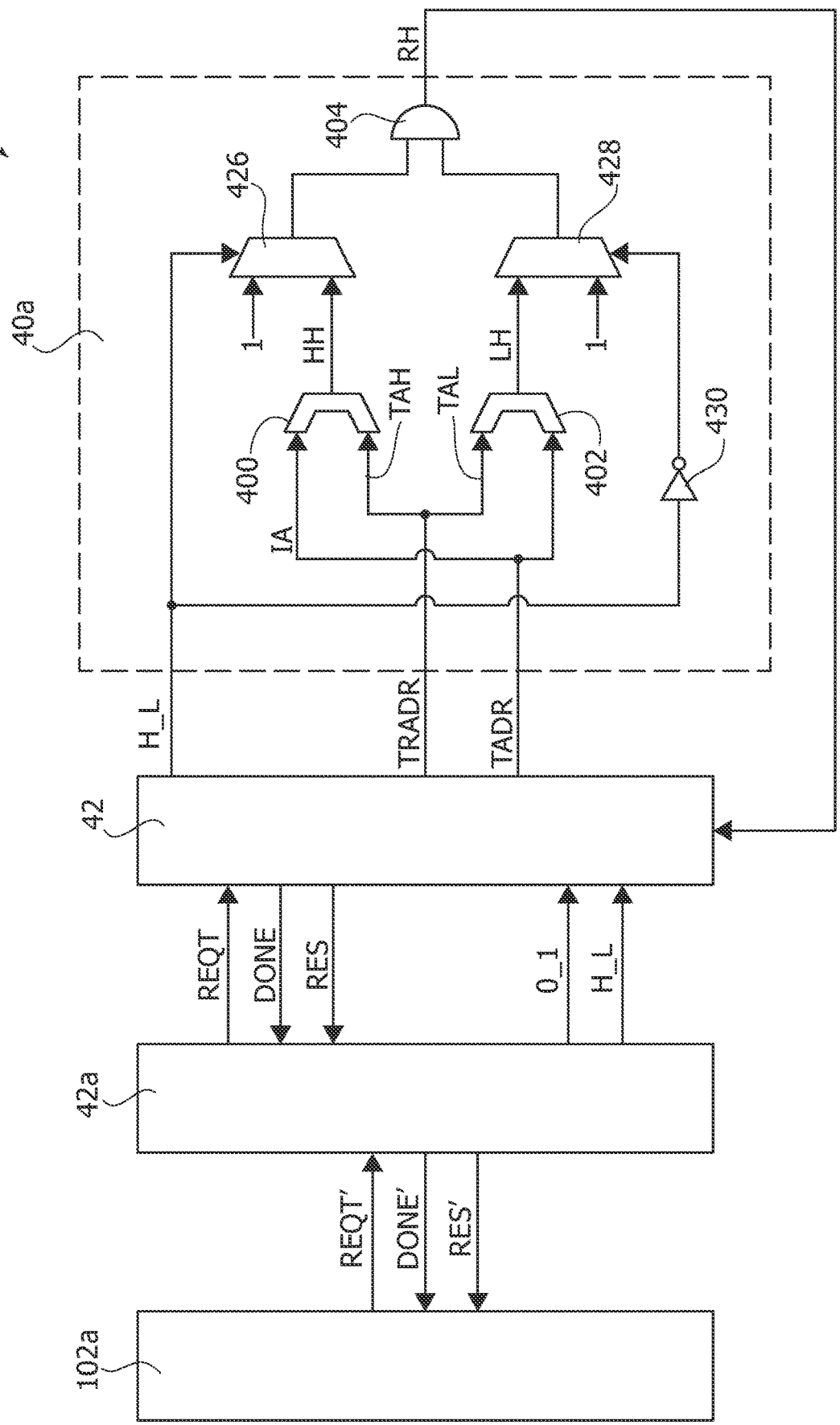
FIG. 18 shows an embodiment of a processing system comprising an address comparison circuit and a respective test circuit.

FIG. 18 shows an embodiment of a processing system 10a comprising a test circuit 42.

Specifically, as mentioned before, a configurable test circuit 42a may be configured to start, in response to a requests signal REQT, a given test indicated via one or more signals, such as the signals 0_1 and/or H_L. In various embodiments, once having started a given test, the configurable test circuit 42 generates the common address limit signal TRADR and the test address signal TADR which are provided to the comparators 400 and 402 (e.g., by using the previously described test mode signal TM). Moreover, when using the masking signal H_L, the test circuit 42 provides the signal H_L to the combinational logic circuits 426 and 428. For example, for the exemplary logic levels of the signal H_L described in the foregoing, the combinational logic circuit 426 may receive the signal H_L and the combinational logic circuit 428 may receive the inverted version of the signal H_L, as schematically shown via an inverter 430. Finally, once having completed the test, the configurable test circuit 42 may provide a completion signal DONE and a result signal RES indicating the result of the test.

Accordingly, in various embodiments, the processing system comprises a circuit, such as the processing core 102a, configured to assert the request signal REQT in order to request the given test, e.g., by providing also the signals 0_1 and/or H_L.

However, as also shown in FIG. 18, in various embodiments, the test circuit 42 may have associated a further sequential logic circuit 42a. For example, this circuit 42a may be configured to receive a further request signal REQT. In response to this request signal REQT, the circuit 42a provides a given combination of signals 0_1 and H_L to the configurable test circuit 42 and asserts the request signal REQ in order to execute the respective test. Once having detected that the test circuit 42 asserts the signal DONE, the circuit 42a may thus change the signals 0_1 and H_L and request a different test. For example, in this way, the circuit 42 may request the execution of:

the tests 4300 and 4500, or the test 4400 and 4600; or
the tests 4300, 4400, 4500 and 4600.

Once all requested tests have been executed, the circuit 42a may thus assert a further signal DONE' indicating that the tests are completed, and provided via a signal RES' the aggregated result of the tests, e.g., the signal RES' may be asserted when all tests are completed without errors (e.g., the signal RES was always de-asserted) and de-asserted when at least one test is completed with an error (e.g., the signal RES was asserted at least one time).

Accordingly, in this case the processing core 102a may be configured to assert the request signal REQ' in order to request the execution of a given sequence of tests.

Accordingly, the embodiments disclosed herein relate to a new solution to test the comparison circuits 40a configured to determine whether an address ADR belongs to a certain memory region. The described solution is executed in hardware, with a minimal execution time, minimal area overhead, and no software intervention. The solution is deterministic because it can be implemented in the front-end design and easily ported to any different address region comparator. Whenever the same region comparator logic is implemented for multiple regions, the adopted solution makes it possible to test them in parallel, reducing the test time during the application start-up. This reduces the complexity and cost associated with the protection of the logic done with traditional approaches, like LBIST, duplication, or software tests.

Of course, without prejudice to the principle of the invention, the details of construction and the embodiments may vary widely with respect to what has been described and illustrated herein purely by way of example, without thereby departing from the scope of the present invention, as defined by the ensuing claims.

What is claimed is:

1. A processing system comprising:
an address comparison circuit configured to compare an address value with an upper address limit and a lower address limit, wherein the address value, the upper address limit and the lower address limit have a given number N of bits, and wherein the address comparison circuit comprises:
a first iterative digital comparator configured to:
compare the address value with the upper address limit,
set an upper-limit comparison signal to a first logic level when the address value is smaller than the upper address limit,
set the upper-limit comparison signal to a second logic level when the address value is greater than the upper address limit, and
set the upper-limit comparison signal to a third logic level when the address value corresponds to the upper address limit, wherein the third logic level corresponds to the first logic level or the second logic level;
a second iterative digital comparator configured to:
compare the address value with the lower address limit,
set a lower-limit comparison signal to a first logic level, when the address value is greater than the lower address limit,
set the lower-limit comparison signal to a second logic level when the address value is smaller than the lower address limit, and
set the lower-limit comparison signal to a third logic level when the address value corresponds to the lower address limit, wherein the third logic level corresponds to the first logic level or the second logic level;
a combinational logic circuit configured to:
assert a combined comparison signal when the upper-limit comparison signal has the respective first logic level and the lower-limit comparison signal has the respective first logic level, and
de-assert the combined comparison signal when the upper-limit comparison signal has the respective second logic level or the lower-limit comparison signal has the respective second logic level; and
a test circuit configured to:
set the address value, the upper address limit and the lower address limit to a given reference bit sequence,
verify whether the upper-limit comparison signal has the respective third logic level and/or whether the lower-limit comparison signal has the respective third logic level,
assert an error signal in response to determining that the upper-limit comparison signal does not have the respective third logic level or the lower-limit comparison signal does not have the respective third logic level,
repeat the following operations for each of the N bits:
set the respective bit of the address value to high, and
set the respective bit of the upper address limit and the lower address limit to low,
verify whether the upper-limit comparison signal has the respective second logic level and/or whether the lower-limit comparison signal has the respective first logic level,
assert the error signal in response to determining that the upper-limit comparison signal has the respective first logic level or the lower-limit comparison signal has the respective second logic level,
set the respective bit of the address value to low, and
set the respective bit of the upper address limit and the lower address limit to high,
verify whether the upper-limit comparison signal has the respective first logic level and/or whether the lower-limit comparison signal has the respective second logic level,
assert the error signal in response to determining that the upper-limit comparison signal has the respective second logic level or the lower-limit comparison signal has the respective first logic level, and
set the respective bit of the address value, the upper address limit and the lower address limit to a given logic level.

2. The processing system according to claim 1, wherein the given reference bit sequence corresponds to:
a first reference sequence having all bits set to low; or
a second reference sequence having all bits set to high.

3. The processing system according to claim 2, wherein the test circuit is configured to:
receive a first signal, and
select as the reference bit sequence:
the first reference sequence when the first signal has a first logic level, and
the second reference sequence when the first signal has a second logic level.

4. The processing system according to claim 3,
wherein the given logic level corresponds to low when the reference bit sequence corresponds to the first reference sequence, and
wherein the given logic level corresponds to high when the reference bit sequence corresponds to the second reference sequence.

5. The processing system according to claim 4, wherein the test circuit is configured to:
receive a second signal in response to determining that the second signal has a first logic level, and
mask the lower-limit comparison signal by setting the lower-limit comparison signal to the respective first logic level,
wherein verifying whether the upper-limit comparison signal has the respective first logic level comprises verifying whether the combined comparison signal is asserted, and
wherein verifying whether the upper-limit comparison signal has the respective second logic level comprises verifying whether the combined comparison signal is de-asserted.

6. The processing system according to claim 5,
wherein the test circuit is configured to mask the upper-limit comparison signal by setting the upper-limit comparison signal to the respective first logic level in response to determining that the second signal has a second logic level,
wherein verifying whether the lower-limit comparison signal has the respective first logic level comprises verifying whether the combined comparison signal is asserted, and
wherein verifying whether the lower-limit comparison signal has the respective second logic level comprises verifying whether the combined comparison signal is de-asserted.

7. The processing system according to claim 6, further comprising a sequential logic circuit configured to:

perform a test of the first iterative digital comparator by setting the second signal to the first logic level and verifying whether the error signal is asserted; and perform a test of the second iterative digital comparator by setting the second signal to the second logic level and verifying whether the error signal is asserted.

8. The processing system according to claim 7, wherein the sequential logic circuit is configured to:
set the first signal to the first logic level and perform a first test of the first iterative digital comparator,
set the first signal to the second logic level and perform a second test of the first iterative digital comparator,
set the first signal to the first logic level and perform a first test of the second iterative digital comparator, and
set the first signal to the second logic level and perform a second test of the second iterative digital comparator.

9. The processing system according to claim 2,
wherein the given logic level corresponds to low when the reference bit sequence corresponds to the first reference sequence, and
wherein the given logic level corresponds to high when the reference bit sequence corresponds to the second reference sequence.

10. The processing system according to claim 1,
wherein the first iterative digital comparator comprises a cascade of a first set of bit comparators, wherein each bit comparator of the first set of bit comparators is configured to generate a respective comparison signal,
wherein a first bit comparator of the first set of bit comparators is configured to:
receive a first bit of the address value and a first bit of the upper address limit,
set the respective comparison signal to the respective first logic level when the first bit of the address value is set to low and the first bit of the upper address limit is set to high,
set the respective comparison signal to the respective second logic level when the first bit of the address value is set to high and the first bit of the upper address limit is set to low, and
set the respective comparison signal to the respective third logic level when the first bit of the address value corresponds to the first bit of the upper address limit, and
wherein the other bit comparators of the first set of bit comparators are configured to:
receive a respective bit of the address value, a respective bit of the upper address limit and the comparison signal of a previous bit comparator of the first set of bit comparators,
set the respective comparison signal to the respective first logic level when the respective bit of the address value is set to low and the respective bit of the upper address limit is set to high,
set the respective comparison signal to the respective second logic level when the respective bit of the address value is set to high and the respective bit of the upper address limit is set to low,
set the respective comparison signal to the logic value of the comparison signal the previous bit comparator when the respective bit of the address value corresponds to the respective bit of the upper address limit, and
wherein the upper-limit comparison signal corresponding to the comparison signal of the last bit comparator of the first set of bit comparators.

11. The processing system according to claim 1,
wherein the second iterative digital comparator comprises a cascade of a second set of bit comparators, wherein each bit comparator of the second set of bit comparators is configured to generate a respective comparison signal, wherein a first bit comparator of the second set of bit comparators is configured to:
receive a first bit of the address value and a first bit of the lower address limit,
set the respective comparison signal to the respective first logic level when the first bit of the address value is set to high and the first bit of the lower address limit is set to low,
set the respective comparison signal to the respective second logic level when the first bit of the address value is set to low and the first bit of the lower address limit is set to high, and
set the respective comparison signal to the respective third logic level when the first bit of the address value corresponds to the first bit of the lower address limit,
wherein the other bit comparators of the second set of bit comparators are configured to:
receive a respective bit of the address value, a respective bit of the lower address limit and the comparison signal of a previous bit comparator of the second set of bit comparators,
set the respective comparison signal to the respective first logic level when the respective bit of the address value is set to high and the respective bit of the lower address limit is set to low,
set the respective comparison signal to the respective second logic level when the respective bit of the address value is set to low and the respective bit of the lower address limit is set to high, and
set the respective comparison signal to the logic value of the comparison signal of the previous bit comparator when the respective bit of the address value corresponds to the respective bit of the lower address limit, and
wherein the lower-limit comparison signal corresponding to the comparison signal of the last bit comparator of the second set of bit comparators.

12. An integrated circuit comprising:
the processing system according to claim 1.

13. A vehicle comprising:
a plurality of processing systems, each processing system according to claim 1,
wherein the processing systems are connected via a further communication system.

14. A method for operating the processing system according to claim 1, the method comprising:
setting the address value, the upper address limit and the lower address limit to the given reference bit sequence;
verifying whether the upper-limit comparison signal has the respective third logic level and/or whether the lower-limit comparison signal has the respective third logic level;
asserting an error signal in response to determining that the upper-limit comparison signal does not have the respective third logic level or the lower-limit comparison signal does not have the respective third logic level; and
repeating the following operations for each of the N bits:
setting the respective bit of the address value to high, and setting the respective bit of the upper address limit and the lower address limit to low;

verifying whether the upper-limit comparison signal has the respective second logic level and/or whether the lower-limit comparison signal has the respective first logic level;

asserting the error signal in response to determining that the upper-limit comparison signal has the respective first logic level or the lower-limit comparison signal has the respective second logic level;

setting the respective bit of the address value to low, and setting the respective bit of the upper address limit and the lower address limit to high;

verifying whether the upper-limit comparison signal has the respective first logic level and/or whether the lower-limit comparison signal has the respective second logic level;

asserting the error signal in response to determining that the upper-limit comparison signal has the respective second logic level or the lower-limit comparison signal has the respective first logic level; and setting the respective bit of the address value, the upper address limit and the lower address limit to a given logic level.

15. A method for operating a processing system, the method comprising:

setting an address value, an upper address limit and a lower address limit to a given reference bit sequence;

verifying whether an upper-limit comparison signal has a respective third logic level and/or whether a lower-limit comparison signal has the respective third logic level;

asserting an error signal in response to determining that the upper-limit comparison signal does not have the respective third logic level or the lower-limit comparison signal does not have the respective third logic level; and repeating the following operations for each of the N bits:
setting a respective bit of the address value to high, and setting a respective bit of the upper address limit and the lower address limit to low;

verifying whether the upper-limit comparison signal has a respective second logic level and/or whether the lower-limit comparison signal has a respective first logic level;

asserting the error signal in response to determining that the upper-limit comparison signal has the respective first logic level or the lower-limit comparison signal has the respective second logic level;

setting the respective bit of the address value to low, and setting the respective bit of the upper address limit and the lower address limit to high;

verifying whether the upper-limit comparison signal has the respective first logic level and/or whether the lower-limit comparison signal has the respective second logic level;

asserting the error signal in response to determining that the upper-limit comparison signal has the respective second logic level or the lower-limit comparison signal has the respective first logic level; and setting the respective bit of the address value, the upper address limit and the lower address limit to a given logic level.

16. A processing system comprising:

an address comparison circuit configured to compare an address value with an upper address limit and a lower address limit, wherein the address value, the upper address limit and the lower address limit have a given number N of bits, and wherein the address comparison circuit comprises:

a first iterative digital comparator comprising:
a first cascade of a first set of first bit comparators, wherein each first bit comparator of the first set of first bit comparators is configured to generate a respective comparison signal, wherein a first bit comparator of the first set of bit comparators is configured to:
receive a first bit of the address value and a first bit of the upper address limit,
set the respective comparison signal to the respective first logic level when the first bit of the address value is set to low and the first bit of the upper address limit is set to high,
set the respective comparison signal to the respective second logic level when the first bit of the address value is set to high and the first bit of the upper address limit is set to low, and
set the respective comparison signal to the respective third logic level when the first bit of the address value corresponds to the first bit of the upper address limit, and wherein the other bit comparators of the first set of bit comparators are configured to:
receive a respective bit of the address value, a respective bit of the upper address limit and the comparison signal of a previous bit comparator of the first set of bit comparators,
set the respective comparison signal to the respective first logic level when the respective bit of the address value is set to low and the respective bit of the upper address limit is set to high,
set the respective comparison signal to the respective second logic level when the respective bit of the address value is set to high and the respective bit of the upper address limit is set to low,
set the respective comparison signal to the logic value of the comparison signal of the previous bit comparator when the respective bit of the address value corresponds to the respective bit of the upper address limit, and wherein an upper-limit comparison signal corresponding to the comparison signal of the last bit comparator of the first set of bit comparators.

17. The processing system according to claim 16, wherein the address comparison circuit further comprises a second iterative digital comparator, and wherein the second iterative digital comparator comprises:

a second cascade of a second set of second bit comparators, wherein each second bit comparator of the second set of second bit comparators is configured to generate a respective comparison signal, wherein a second bit comparator of the second set of second bit comparators is configured to:
receive a first bit of the address value and a first bit of the lower address limit,
set the respective comparison signal to the respective first logic level when the first bit of the address value is set to high and the first bit of the lower address limit is set to low,
set the respective comparison signal to the respective second logic level when the first bit of the address value is set to low and the first bit of the lower address limit is set to high, and
set the respective comparison signal to the respective third logic level when the first bit of the address value corresponds to the first bit of the lower address limit, wherein the other bit comparators of the second set of bit comparators are configured to:
  receive a respective bit of the address value, a respective bit of the lower address limit and the comparison signal of a previous bit comparator of the second set of bit comparators,
  set the respective comparison signal to the respective first logic level when the respective bit of the address value is set to high and the respective bit of the lower address limit is set to low,
  set the respective comparison signal to the respective second logic level when the respective bit of the address value is set to low and the respective bit of the lower address limit is set to high, and
  set the respective comparison signal to the logic value of the comparison signal of the previous bit comparator when the respective bit of the address value corresponds to the respective bit of the lower address limit, and
wherein a lower-limit comparison signal corresponding to the comparison signal of the last bit comparator of the second set of bit comparators.

18. The processing system according to claim 17, further comprising a test circuit configured to:
  set the address value, the upper address limit and the lower address limit to a given reference bit sequence;
  verify whether the upper-limit comparison signal has the respective third logic level and/or whether the lower-limit comparison signal has the respective third logic level;
  assert an error signal in response to determining that the upper-limit comparison signal does not have the respective third logic level or the lower-limit comparison signal does not have the respective third logic level; and
  repeat the following operations for each of the N bits:
    set the respective bit of the address value to high, and set the respective bit of the upper address limit and the lower address limit to low;
    verify whether the upper-limit comparison signal has the respective second logic level and/or whether the lower-limit comparison signal has the respective first logic level;
    assert the error signal in response to determining that the upper-limit comparison signal has the respective first logic level or the lower-limit comparison signal has the respective second logic level;
    set the respective bit of the address value to low, and set the respective bit of the upper address limit and the lower address limit to high;
    verify whether the upper-limit comparison signal has the respective first logic level and/or whether the lower-limit comparison signal has the respective second logic level;
    assert the error signal in response to determining that the upper-limit comparison signal has the respective second logic level or the lower-limit comparison signal has the respective first logic level; and
    set the respective bit of the address value, the upper address limit and the lower address limit to a given logic level.

19. The processing system according to claim 18, wherein the given reference bit sequence corresponds to:
  a first reference sequence having all bits set to low; or
  a second reference sequence having all bits set to high.

20. The processing system according to claim 19, wherein the test circuit is configured to:
  receive a first signal, and
  select as the reference bit sequence:
    the first reference sequence when the first signal has a first logic level, and
    the second reference sequence when the first signal has a second logic level.

* * * * *

UNITED STATES PATENT AND TRADEMARK OFFICE
CERTIFICATE OF CORRECTION

| | | |
|---|---|---|
| PATENT NO. | : 12,019,118 B2 | Page 1 of 1 |
| APPLICATION NO. | : 18/186549 | |
| DATED | : June 25, 2024 | |
| INVENTOR(S) | : Roberto Colombo, Vivek Mohan Sharma and Samiksha Agarwal | |

It is certified that error appears in the above-identified patent and that said Letters Patent is hereby corrected as shown below:

In the Claims

In Column 27, Line 61, Claim 10:
Change "the comparison signal the previous bit comparator"
To --the comparison signal of the previous bit comparator--

Signed and Sealed this
Thirtieth Day of July, 2024

*Katherine Kelly Vidal*
*Director of the United States Patent and Trademark Office*